US010937818B2

(12) United States Patent
Kondo

(10) Patent No.: US 10,937,818 B2
(45) Date of Patent: Mar. 2, 2021

(54) SOLID STATE IMAGING DEVICE

(71) Applicant: OLYMPUS CORPORATION, Hachioji (JP)

(72) Inventor: Toru Kondo, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 430 days.

(21) Appl. No.: 15/944,258

(22) Filed: Apr. 3, 2018

(65) Prior Publication Data
US 2018/0226441 A1   Aug. 9, 2018

Related U.S. Application Data

(63) Continuation of application No. PCT/JP2015/081170, filed on Nov. 5, 2015.

(51) Int. Cl.
*H01L 27/146* (2006.01)
*H04N 5/369* (2011.01)
(Continued)

(52) U.S. Cl.
CPC ...... *H01L 27/146* (2013.01); *H01L 27/14605* (2013.01); *H01L 27/14612* (2013.01);
(Continued)

(58) Field of Classification Search
CPC ........ H01L 27/14609; H01L 27/14612; H01L 27/14636; H04N 5/374; H04N 5/378; H04N 5/379
(Continued)

(56) References Cited

U.S. PATENT DOCUMENTS 5,818,526 A * 10/1998 Nomoto
10,356,354 B2 * 7/2019 Shikina
(Continued)

FOREIGN PATENT DOCUMENTS

JP   2008-048313 A   2/2008
JP   2010-225927 A   10/2010
(Continued)

OTHER PUBLICATIONS

Office Action dated Aug. 6, 2019, issued in counterpart JP application No. 2017-548577, with English translation. (20 pages).
(Continued)

*Primary Examiner* — Kevin K Pyo
(74) *Attorney, Agent, or Firm* — Westerman, Hattori, Daniels & Adrian, LLP

(57) ABSTRACT

A solid-state imaging device includes a first semiconductor substrate including a pixel array unit, a second semiconductor substrate stacked on a surface of a side opposite to a side on which light is incident in the first semiconductor substrate and on which a pixel control circuit and a reading circuit are arranged, and a plurality of connection electrodes configured to electrically connect pixel control signal lines between the first semiconductor substrate and the second semiconductor substrate, wherein the connection electrodes electrically connect pixel control signal lines within a pixel immediate region which overlaps a region where the pixel array unit is arranged in the first semiconductor substrate, and the pixel control circuit is arranged along an edge of the pixels in either one of a row direction and a column direction arranged in the pixel array unit in the pixel immediate region.

6 Claims, 11 Drawing Sheets

(51) Int. Cl.
H04N 5/378 (2011.01)
H04N 5/374 (2011.01)

(52) U.S. Cl.
CPC .. *H01L 27/14634* (2013.01); *H01L 27/14636* (2013.01); *H04N 5/369* (2013.01); *H04N 5/374* (2013.01); *H04N 5/378* (2013.01); *H04N 5/379* (2018.08); *H01L 27/14643* (2013.01)

(58) Field of Classification Search
USPC .................................................. 250/208.1
See application file for complete search history.

(56) References Cited

U.S. PATENT DOCUMENTS

2012/0293698 A1 11/2012 Sukegawa et al.
2014/0240566 A1 8/2014 Shizukuishi

FOREIGN PATENT DOCUMENTS

JP 2012-104684 A 5/2012
JP 2014-30170 A 2/2014
WO 2011/083722 A1 7/2011

OTHER PUBLICATIONS

International Search Report dated Dec. 8, 2015, issued in counterpart International Application No. PCT/JP2015/081170, w/English translation (3 pages).

* cited by examiner

SOLID STATE IMAGING DEVICE

The present application is a continuation application of PCT Patent Application No. PCT/JP2015/081170, filed on Nov. 5, 2015 and amended on Feb. 21, 2017 under Article 19.

TECHNICAL FIELD

The present invention relates to a solid-state imaging device.

BACKGROUND ART

In recent years, a complementary metal oxide semiconductor (CMOS) type solid-state imaging device (hereinafter simply referred to as a "solid-state imaging device") using a CMOS transistor has been practically used as a solid-state imaging device mounted on an imaging device such as a digital camera, a digital video camera, or an endoscope. In this solid-state imaging device, a device having a configuration in which a column signal processing circuit configured to perform a correlated double sampling (CDS) process, a digital-to-analog conversion process, or the like is embedded for each column of the pixel array unit in which a plurality of pixels are arranged in a two-dimensional matrix has been developed and productized.

In a solid-state imaging device of a general monolithic structure (a structure manufactured with a single semiconductor substrate), various peripheral circuits are arranged around the pixel array unit. In addition to the above-described column signal processing circuit, the peripheral circuits includes logic circuits such as a control signal generation circuit, a pixel control circuit (also referred to as a vertical scanning circuit), a horizontal reading control circuit (also referred to as a horizontal scanning circuit), and an output circuit.

Meanwhile, in recent solid-state imaging devices, the number of pixels has been increased. However, if the number of pixels in a solid-state imaging device including a column signal processing circuit is increased, an area of the semiconductor substrate (a chip area) is increased and a size of the solid-state imaging device is increased in the monolithic structure. Also, in recent solid-state imaging devices, the reduction of the size (a projection area) has also been required.

Therefore, in recent years, technology of a stacked solid-state imaging device of which the size is reduced by separately arranging components of a solid-state imaging device on a plurality of semiconductor substrates and stacking the semiconductor substrates has been proposed.

For example, in the technology disclosed in Japanese Unexamined Patent Application, First Publication No. 2012-104684, a pixel array unit in which a plurality of pixels are arranged, and a pixel control circuit are arranged on a first semiconductor substrate, peripheral circuits other than the pixel control circuit are arranged on a second semiconductor substrate, and the semiconductor substrates are stacked. At this time, in Japanese Unexamined Patent Application, First Publication No. 2012-104684, column signal processing circuits corresponding to pixels of columns arranged in the pixel array unit are arranged in a region of the second semiconductor substrate corresponding to a region of the first semiconductor substrate on which the pixel array unit is arranged, i.e., a region below the pixel array unit. In Japanese Unexamined Patent Application, First Publication No. 2012-104684, the pixels of the columns are connected to the corresponding column signal processing circuits within a region corresponding to the pixel array unit. According to this configuration, in Japanese Unexamined Patent Application, First Publication No. 2012-104684, a chip area of the solid-state imaging device is reduced and more specifically an area required for arranging the column signal processing circuits is reduced in the case of a monolithic structure.

Also, for example, in the technology disclosed in Japanese Unexamined Patent Application, First Publication No. 2010-225927, a pixel array unit is arranged on a first semiconductor substrate, peripheral circuits are arranged on a second semiconductor substrate, and the semiconductor substrates are stacked. In this case, in Japanese Unexamined Patent Application, First Publication No. 2010-225927, a pixel control circuit is arranged in a region below the pixel array unit in the second semiconductor substrate. In Japanese Unexamined Patent Application, First Publication No. 2010-225927, a connection for a driving signal output by the pixel control circuit arranged on the second semiconductor substrate to each pixel is established via a micro-bump and a driving signal in which an influence of a delay is reduced is supplied to each pixel arranged in the pixel array unit. According to the configuration disclosed in Japanese Unexamined Patent Application, First Publication No. 2010-225927, it is possible to reduce a chip area as compared with a solid-state imaging device having a monolithic structure and more specifically reduce an area required for arranging the pixel control circuit.

SUMMARY OF INVENTION

According to a first aspect of the present invention, a solid-state imaging device includes a first semiconductor substrate having a pixel array unit in which a plurality of pixels configured to convert incident light into pixel signals are arranged in a two-dimensional matrix; a second semiconductor substrate stacked on a surface of a side opposite to a side on which the light is incident in the first semiconductor substrate and on which a pixel control circuit configured to output pixel control signals for controlling reading of the pixel signals from the pixels and a reading circuit configured to output each output signal obtained by processing each of the read pixel signals are arranged; and a plurality of connection electrodes corresponding to pixel control signal lines through which the pixel control signals are transferred and configured to electrically connect the corresponding pixel control signal lines between the first semiconductor substrate and the second semiconductor substrate, wherein substantially all circuit elements of the pixel control circuit and the reading circuit are arranged within a pixel immediate region which overlaps a region where the pixel array unit is arranged on the first semiconductor substrate when viewed from the side on which the light is incident, wherein each of the connection electrodes electrically connects together a first pixel control signal line, which is the pixel control signal line wired in the first semiconductor substrate, and a second pixel control signal line, which is the pixel control signal line wired in the second semiconductor substrate within the pixel immediate region, and wherein the pixel control circuit is arranged along either one of a row direction and a column direction of the pixels arranged in the pixel array unit in the pixel immediate region and includes a plurality of pixel control circuit units corresponding to each row of the pixels arranged in the pixel array unit and configured to output the pixel control signals for reading the pixel signals from the pixels from the corresponding rows.

According to a second aspect of the present invention, in the solid-state imaging device of the above-described first aspect, each of the pixel control circuit units may be sequentially arranged in an order of rows of the corresponding pixels within a region along the row direction, the first pixel control signal line may be wired along the row direction in common to the pixels arranged in the same row, the second pixel control signal line may be wired along the column direction from a position at which the corresponding pixel control circuit unit is arranged, and each of the connection electrodes may be arranged at a position where the corresponding first pixel control signal line intersects the corresponding second pixel control signal line and distances to the connection electrodes connected to the plurality of pixel control circuit units may differ according to each corresponding pixel row.

According to a third aspect of the present invention, in the solid-state imaging device of the above-described first aspect, each of the pixel control circuit units may include an address decoder configured to decode an input address signal and output the pixel control signal when the address signal indicates a predetermined address value in a state in which address values different from each other are predetermined, each of the pixel control circuit units may be arranged so that the pixel control circuit units corresponding to the pixels of adjacent rows are not adjacent to each other within the region along the row direction, the first pixel control signal line may be wired along the row direction in common to the pixels arranged in the same row, the second pixel control signal line may be wired along the column direction from a position at which the corresponding pixel control circuit unit is arranged, and each of the connection electrodes may be arranged at a position where the corresponding first pixel control signal line intersects the corresponding second pixel control signal line and distances to the connection electrodes connected to the plurality of pixel control circuit units may differ according to each corresponding pixel row.

According to a fourth aspect of the present invention, in the solid-state imaging device of the above-described third aspect, the second pixel control signal line may include a third pixel control signal line wired to move a position where the corresponding connection electrode is arranged along the row direction from a position where the second pixel control signal line intersects the corresponding first pixel control signal line, and each of the connection electrodes may be electrically connected to the corresponding first pixel control signal line at a position moved by the third pixel control signal line.

According to a fifth aspect of the present invention, in the solid-state imaging device of the above-described fourth aspect, each of the pixel control circuit units may be arranged within a region having a width narrower than a width of the pixel array unit in the row direction.

According to a sixth aspect of the present invention, in the solid-state imaging device of the above-described fifth aspect, the region having the narrower width in which each of the pixel control circuit units may be arranged is located close to one end or both ends in the row direction.

According to a seventh aspect of the present invention, in the solid-state imaging device of the above-described first aspect, each of the pixel control circuit units may be sequentially arranged in an order of rows of the corresponding pixels within a region having a width narrower than a width thereof in the column direction along the column direction, the first pixel control signal line may be wired along the row direction in common to the pixels arranged in the same row, the second pixel control signal line may be connected to a third pixel control signal line wired to transfer the pixel control signal along the row direction from a position at which the pixel control circuit unit is arranged and wired along the column direction from a position connected to the third pixel control signal line, and each of the connection electrodes may be arranged at a position where the corresponding first pixel control signal line intersects the corresponding second pixel control signal line and distances to the connection electrodes connected to the plurality of pixel control circuit units may differ according to each corresponding pixel row.

DESCRIPTION OF EMBODIMENTS

First Embodiment

Figure 1:
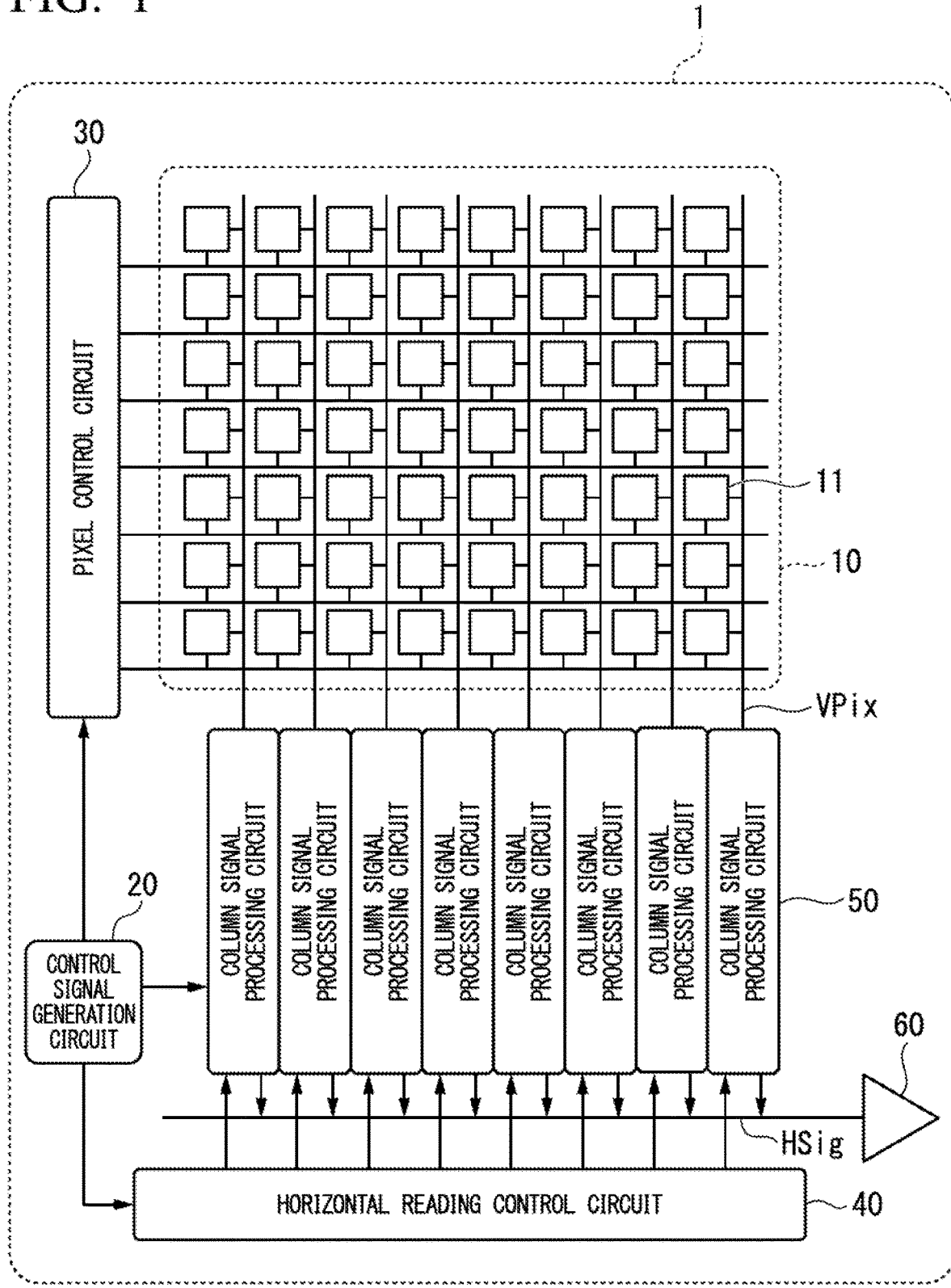
FIG. 1 is a block diagram showing a schematic configuration of a solid-state imaging device according to a first embodiment of the present invention.

Hereinafter, embodiments of the present invention will be described with reference to the drawings. FIG. 1 is a block diagram showing a schematic configuration of a solid-state imaging device according to a first embodiment of the present invention. The solid-state imaging device according to the first embodiment of the present invention is a CMOS type solid-state imaging device configured to convert incident light into an electrical signal and output the electrical signal. In FIG. 1, the solid-state imaging device 1 includes a pixel array unit 10 in which a plurality of pixels 11 are arranged, a control signal generation circuit 20, a pixel control circuit 30, a horizontal reading control circuit 40, a column signal processing circuit 50, and an output circuit 60. In the solid-state imaging device 1 shown in FIG. 1, an example of the pixel array unit 10 in which a plurality of pixels 11 are arranged in a two-dimensional matrix in 7 rows and 8 columns is shown.

The control signal generation circuit 20 controls the pixel control circuit 30, the horizontal reading control circuit 40, and the column signal processing circuit 50.

The pixel control circuit 30 is a driving circuit configured to control each pixel 11 within the pixel array unit 10 and cause a pixel signal of each pixel 11 to be output (read) to a pixel signal output line VPix in accordance with control from the control signal generation circuit 20 and is also referred to as a vertical scanning circuit. The pixel control circuit 30 outputs a pixel control signal for controlling (driving) the pixel 11 for each row of the pixels 11 provided in the pixel array unit 10. Also, the pixel control signal for allowing the pixel control circuit 30 to control (drive) the pixel 11 will be described below.

Each pixel 11 arranged within the pixel array unit 10 converts the incident light into a pixel signal and outputs a pixel signal according to an amount of incident light (an amount of light) to the corresponding pixel signal output line VPix in accordance with the pixel control signal input from the pixel control circuit 30. A detailed description of a configuration of the pixel 11 will be described below.

The column signal processing circuit 50 is arranged in correspondence with each column of the pixel array unit 10 and is a processing circuit configured to perform circuit processing such as noise suppression on the pixel signal output from the pixel 11 of the corresponding column to the corresponding pixel signal output line VPix in accordance with control from the control signal generation circuit 20. For example, the column signal processing circuit 50 performs processing such as noise suppression by correlated double sampling (CDS), signal amplification, and AD conversion. The column signal processing circuit 50 outputs the pixel signal processed in accordance with control from the horizontal reading control circuit 40 as an output signal to a horizontal signal line HSig.

The horizontal reading control circuit 40 is a driving circuit configured to sequentially read processed pixel signals (output signals) output from the column signal processing circuits 50 arranged in correspondence with the columns of the pixel array unit 10 to the horizontal signal line HSig and is also referred to as a horizontal scanning circuit.

The output circuit 60 is a circuit such as an output amplifier configured to output an output signal from the column signal processing circuit 50 read to the horizontal signal line HSig by the horizontal reading control circuit 40 to outside of the solid-state imaging device 1.

Figure 2:
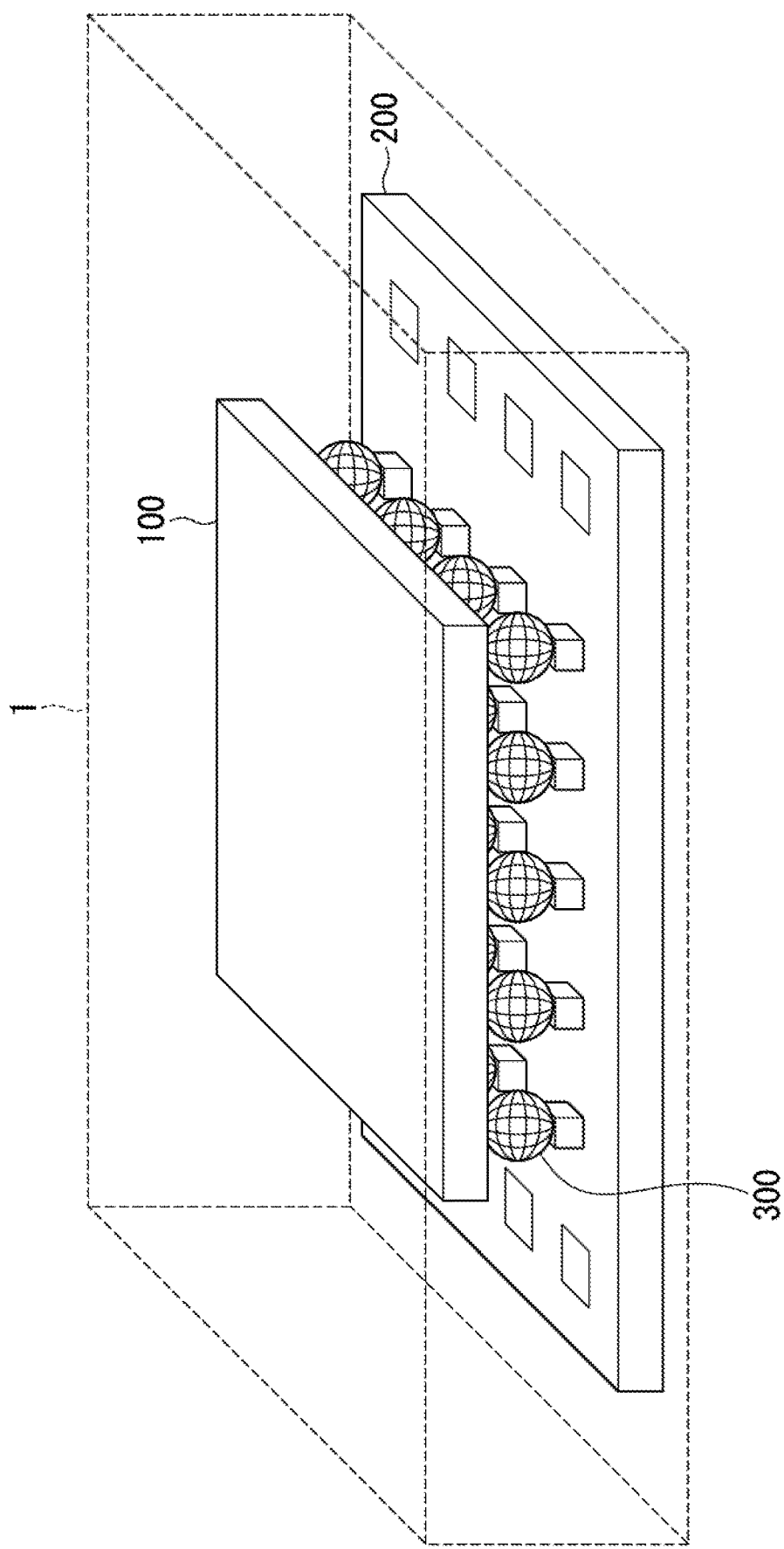
FIG. 2 is a schematic diagram showing the schematic configuration of the solid-state imaging device according to the first embodiment of the present invention.

Next, an overview of the solid-state imaging device 1 will be described. The solid-state imaging device 1 is configured by stacking (bonding) a plurality of semiconductor substrates. FIG. 2 is a schematic diagram showing a schematic configuration of the solid-state imaging device 1 according to the first embodiment of the present invention. In FIG. 2, an example of the solid-state imaging device 1 in which circuit elements for implementing a function of the solid-state imaging device 1 are separately arranged on two semiconductor substrates including a first semiconductor substrate 100 and a second semiconductor substrate 200, and the first semiconductor substrate 100 and the second semiconductor substrate 200 are bonded by chip connection electrodes 300 is shown.

In the solid-state imaging device 1, each circuit element is arranged on either of the first semiconductor substrate 100 on which light is incident and the second semiconductor substrate 200 stacked on a surface of a side opposite to a surface of a side on which the light is incident in the first semiconductor substrate 100. In the solid-state imaging device 1, signal lines of the circuit elements arranged on the semiconductor substrates are electrically connected by the chip connection electrodes 300. As the chip connection electrode 300, for example, a micro-bump fabricated (formed) by a vapor deposition method, a plating method, or the like is used. In the solid-state imaging device 1, the circuit elements arranged on the first semiconductor substrate 100 and the circuit elements arranged on the second semiconductor substrate 200 perform signal transmission and reception via the chip connection electrodes 300.

Figure 3:
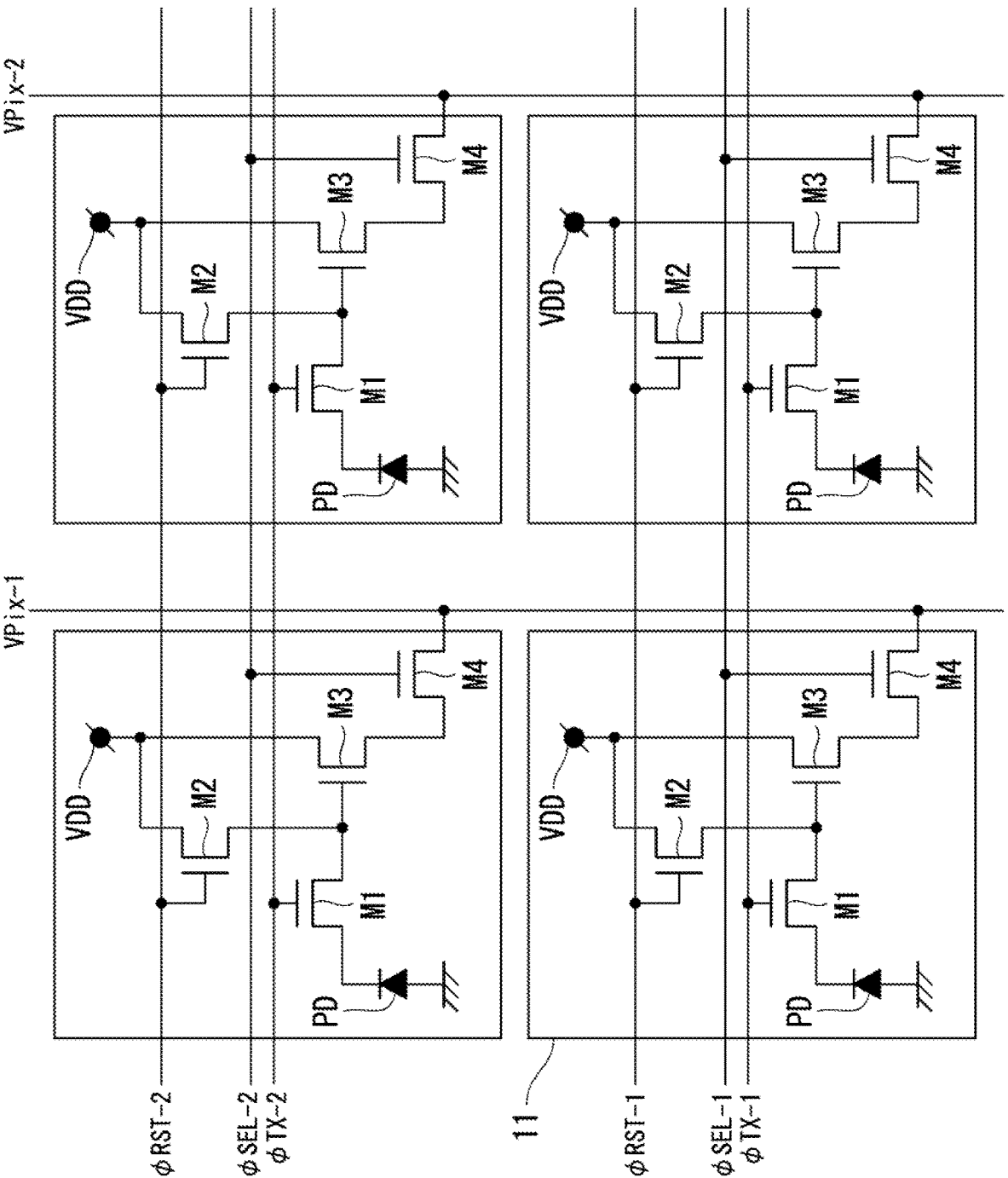
FIG. 3 is a circuit diagram showing an example of a configuration of a pixel in the solid-state imaging device according to the first embodiment of the present invention.

Next, the pixels 11 arranged in the pixel array unit 10 provided in the solid-state imaging device 1 will be described. FIG. 3 is a circuit diagram showing an example of the configuration of the pixels 11 arranged in the pixel array unit 10 in the solid-state imaging device 1 according to the first embodiment of the present invention. FIG. 3 shows an example of a state in which four pixels 11 within the pixel array unit 10 are arranged in a two-dimensional matrix in two rows and two columns.

Each pixel 11 includes a photoelectrical conversion element PD, a transfer transistor M1, a pixel reset transistor M2, an amplification transistor M3, and a selection transistor M4. The pixel 11 outputs a pixel signal obtained by converting incident light into an electrical signal in accordance with each pixel control signal input from the pixel control circuit 30 to the corresponding pixel signal output line VPix.

In FIG. 3, after "-" following a signal name of each pixel control signal, a number indicating the row of the corresponding pixel 11 is shown. For example, in each of the pixel control signals for controlling the pixels 11 in the first row, "-" following the signal name is followed by "1" indicating the pixel 11 of the first row. Also, in FIG. 3, after "-" following the pixel signal output line VPix, a number indicating the column of the corresponding pixel 11 is shown. For example, "2" indicating the pixel 11 of the second column is shown after "-" in the pixel signal output line VPix corresponding to each pixel 11 in the second column. In the following description, the pixel 11 in the first column arranged in the first row of the pixel array unit 10 will be described as a representative of the pixels 11.

The photoelectrical conversion element PD is a photodiode configured to photoelectrically convert incident light to generate a charge signal and store the generated charge signal.

The transfer transistor M1 transfers the charge signal generated and stored by the photoelectrical conversion element PD to a gate terminal of the amplification transistor M3 in accordance with a pixel control signal φTX-1 input from the pixel control circuit 30. Thereby, the charge signal transferred by the transfer transistor M1 is stored in a node capacitor (not shown) which is a capacitor attached to the node connected to the gate terminal of the amplification transistor M3.

The amplification transistor M3 outputs the charge signal transferred to the gate terminal thereof by the transfer transistor M1, i.e., a signal voltage corresponding to the charge signal stored in the node capacitor (not shown), to the selection transistor M4.

The pixel reset transistor M2 resets the charge signal within the pixel 11 to a power supply voltage VDD in accordance with a pixel control signal ϕRST-1 input from the pixel control circuit 30.

The selection transistor M4 outputs the signal voltage output from the amplification transistor M3 as the pixel signal of the pixel 11 to the pixel signal output line VPix in accordance with a pixel control signal ϕSEL-1 input from the pixel control circuit 30. Thereby, a pixel signal corresponding to the charge signal generated by the photoelectrical conversion element PD provided in the pixel 11 is read to the pixel signal output line VPix.

According to such a configuration, in the pixel 11, each signal voltage corresponding to the charge signal obtained by photoelectrical conversion of the light incident on the photoelectrical conversion element PD is read as a pixel signal to the pixel signal output line VPix. More specifically, in the solid-state imaging device 1, the pixel control circuit 30 controls (drives) the pixel 11 provided in the pixel array unit 10 for each row and causes the pixel signal of each pixel 11 to be read to the pixel signal output line VPix.

(Example of Arrangement of Circuit Elements)

Figure 4:
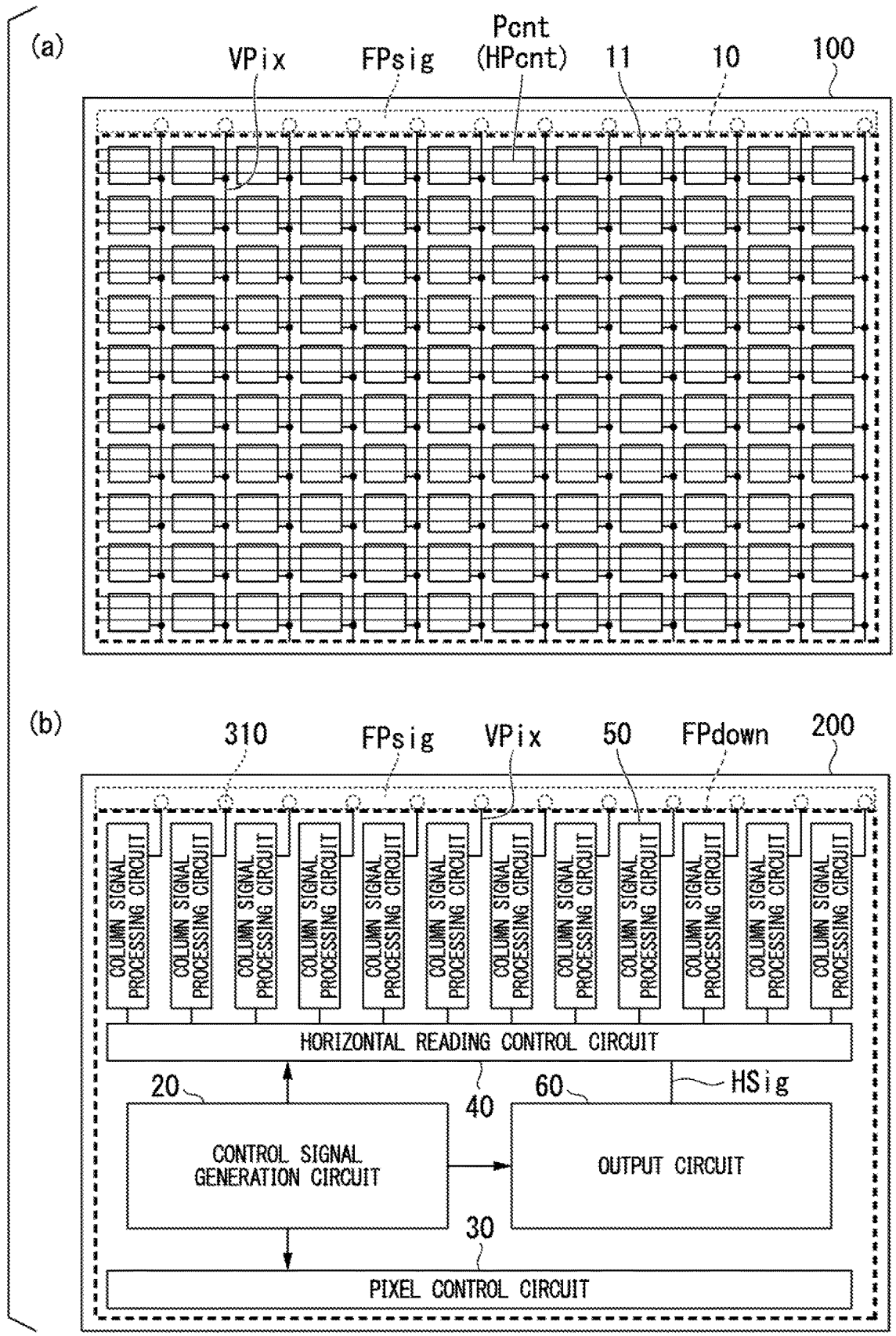
FIG. 4 is a diagram schematically showing an example of an arrangement of components provided in the solid-state imaging device according to the first embodiment of the present invention on semiconductor substrates.

Next, an example of an arrangement of circuit elements in the solid-state imaging device 1 (hereinafter referred to as a "first arrangement example") will be described. As described above, in the solid-state imaging device 1, each circuit element is arranged on either one of the first semiconductor substrate 100 and the second semiconductor substrate 200. FIG. 4 is a diagram schematically showing an example of an arrangement of components (circuit elements) provided in the solid-state imaging device 1 according to the first embodiment of the present invention on semiconductor substrates (the first semiconductor substrate 100 and the second semiconductor substrate 200) (the first arrangement example). Each component (circuit element) arranged on the first semiconductor substrate 100 is shown in (a) of FIG. 4 and each component (circuit element) arranged on the second semiconductor substrate 200 is shown in (b) of FIG. 4.

As shown in (a) of FIG. 4, in the solid-state imaging device 1, the pixel array unit 10 is arranged on the first semiconductor substrate 100. In the first semiconductor substrate 100, as shown in (a) of FIG. 4, a plurality of pixels 11 are arranged in a two-dimensional matrix in the pixel array unit 10. In (a) of FIG. 4, an example of the pixel array unit 10 in which a plurality of pixels 11 are arranged in a two-dimensional matrix in 10 rows and 12 columns is shown.

In the first semiconductor substrate 100, as shown in (a) of FIG. 4, signal lines (hereinafter referred to as "pixel control signal lines Pcnt") through which three pixel control signals (the pixel control signal ϕTX, the pixel control signal ϕRST, and the pixel control signal ϕSEL) output from the pixel control circuit 30 are transferred to each pixel 11 are connected for each row. That is, in the first semiconductor substrate 100, three pixel control signal lines Pcnt common to the pixels 11 arranged in the same row are wired along the row direction (the horizontal direction) of the pixel array unit 10.

Also, in the first semiconductor substrate 100, as shown in (a) of FIG. 4, each pixel signal output line VPix for outputting a pixel signal to a corresponding column signal processing circuit 50 is connected to the pixels 11 for each column. That is, in the first semiconductor substrate 100, the pixel signal output line VPix common to the pixels 11 arranged in the same column is wired along the column direction (the vertical direction) of the pixel array unit 10. Each pixel signal output line VPix is electrically connected by a chip connection electrode 300 for connecting the pixel signal output line VPix between the first semiconductor substrate 100 and the second semiconductor substrate 200 formed within a pixel signal line connection region FPsig (hereinafter referred to as a "pixel signal line connection electrode 310"). Thereby, the pixel signal output from the pixel 11 arranged in each column within the pixel array unit 10 is transferred to the second semiconductor substrate 200 via the corresponding pixel signal line connection electrode 310 and input to the corresponding column signal processing circuit 50.

Also, as shown in (b) of FIG. 4, in the solid-state imaging device 1, the control signal generation circuit 20, the pixel control circuit 30, the horizontal reading control circuit 40, the column signal processing circuit 50, and the output circuit 60 are arranged on the second semiconductor substrate 200. At this time, in the solid-state imaging device 1, the components are arranged in a region of the second semiconductor substrate 200 serving as a side below the region where the pixel array unit 10 is arranged in the first semiconductor substrate 100. That is, in the solid-state imaging device 1, the components are arranged in the region of the second semiconductor substrate 200 (hereinafter referred to as a "pixel array unit immediate region FPdown") overlapping the region of the pixel array unit 10 arranged on the first semiconductor substrate 100 when viewed from a side on which light is incident in a state in which the solid-state imaging device 1 is configured as shown in FIG. 2.

In the first arrangement example, a region where the pixel control circuit 30 is arranged within the pixel array unit immediate region FPdown is assumed to be a region having a shape of the pixel array unit 10 along the row direction (the horizontal direction). In the example shown in (b) of FIG. 4, a case in which a region where the pixel control circuit 30 is arranged is a region of a laterally elongated shape having a width of the pixel array unit 10 in the row direction at a position of an opposite side of the pixel signal line connection region FPsig is shown. That is, a case in which the region where the pixel control circuit 30 is arranged is a region along an edge of the pixel array unit 10 in the row direction at the opposite side of the pixel signal line connection region FPsig in the pixel array unit immediate region FPdown is shown.

Also, the other components arranged on the second semiconductor substrate 200, i.e., the control signal generation circuit 20, the horizontal reading control circuit 40, the column signal processing circuit 50, and the output circuit 60, are arranged in a region with an appropriate shape at a position where routing of signal lines connecting components within the second semiconductor substrate 200 is facilitated.

Also, in the first arrangement example, in the second semiconductor substrate 200, signal lines (pixel control signal lines Pcnt) of the pixel control signals output by the pixel control circuit 30 arranged in the region having the shape along the row direction (the horizontal direction) of the pixel array unit 10 are wired along the column direction (the vertical direction) of the pixel array unit 10. In the following description, the pixel control signal line Pcnt wired along the row direction (the horizontal direction) for transferring the pixel control signal to each pixel 11 in the first semiconductor substrate 100 is referred to as a "horizontal pixel control signal line HPcnt" and the pixel control signal line Pcnt wired along the column direction (the vertical direction) for transferring the pixel control signal output from the pixel control circuit 30 in the second semiconductor substrate 200 is referred to as a "vertical pixel control signal line VPcnt" for distinguishing between them. A description of the wiring of each pixel control signal line Pcnt within the second semiconductor substrate 200 will be described below.

In the first arrangement example, the corresponding horizontal pixel control signal line HPcnt and the corresponding vertical pixel control signal line VPcnt are electrically connected by a chip connection electrode 300 (hereinafter referred to as a "pixel control signal line connection electrode 320") for connecting a pixel control signal between the first semiconductor substrate 100 and the second semiconductor substrate 200 formed within the pixel array unit immediate region FPdown. That is, in the first arrangement example, the pixel control signal line connection electrode 320 corresponding to each pixel control signal is arranged within the pixel control signal line connection region.

Thereby, in the first arrangement example, three pixel control signals (the pixel control signal ϕTX, the pixel control signal ϕRST, and the pixel control signal ϕSEL) output by the pixel control circuit 30 for controlling (driving) the pixels 11 arranged in the same row for each row are transferred through the vertical pixel control signal line VPcnt, the pixel control signal line connection electrode 320, and the horizontal pixel control signal line HPcnt, and input to each pixel 11 within the pixel array unit 10. That is, in the first arrangement example, each of the three pixel control signals output by the pixel control circuit 30 arranged on the second semiconductor substrate 200 is transferred to the first semiconductor substrate 100 through the vertical pixel control signal line VPcnt and the pixel control signal line connection electrode 320, further transferred into the first semiconductor substrate 100 through the horizontal pixel control signal line HPcnt, and input to the pixels 11.

Figure 5:
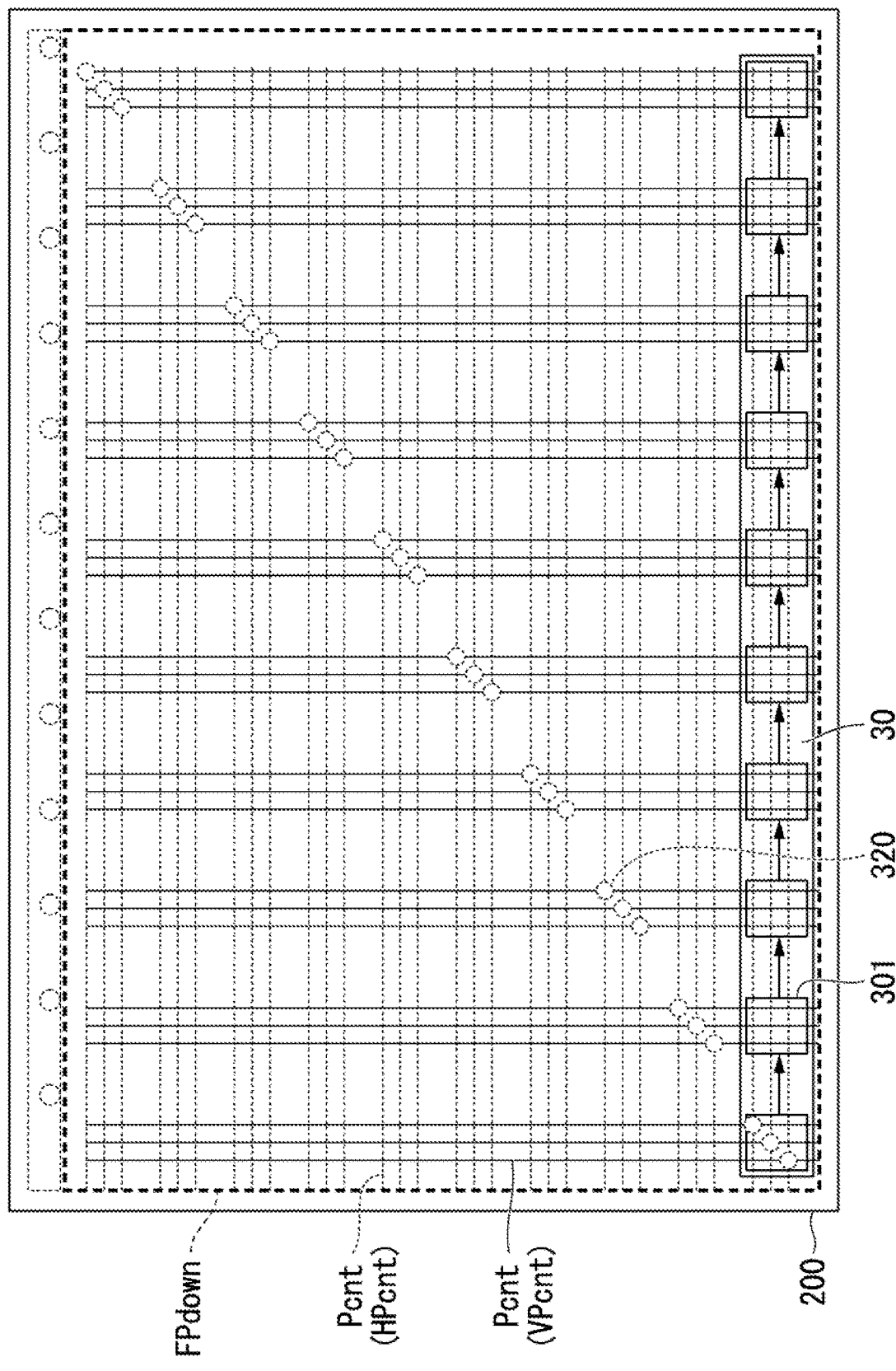
FIG. 5 is a diagram schematically showing an example of an arrangement of chip connection electrodes in a second semiconductor substrate of the solid-state imaging device according to the first embodiment of the present invention.

Here, the arrangement of the pixel control signal line connection electrodes 320 in the first arrangement example of the solid-state imaging device 1 will be described. FIG. 5 is a diagram schematically showing an example of the arrangement of the chip connection electrodes (the pixel control signal line connection electrodes 320) in the second semiconductor substrate 200 of the solid-state imaging device 1 according to the first embodiment of the present invention. In FIG. 5, the example of the arrangement of the pixel control signal line connection electrodes 320 in the second semiconductor substrate 200 on which the components (the circuit elements) of the solid-state imaging device 1 are arranged as shown in (b) of FIG. 4 is shown. In FIG. 5, if the pixel array unit 10 is arranged as shown in (a) of FIG. 4, the horizontal pixel control signal line HPcnt wired along the row direction (the horizontal direction) of to the pixel array unit 10 within the first semiconductor substrate 100 to transfer the pixel control signal to each pixel 11 is indicated by a dotted line.

Also, in FIG. 5, a plurality of pixel control circuit units 301 provided in the pixel control circuit 30 and configured to generate pixel control signals to be output to the pixels 11 of the corresponding rows are shown. When a reading timing signal indicating a timing at which the pixel signal is read from the pixel 11 is input, the pixel control circuit unit 301 generates three pixel control signals (the pixel control signal ϕTX, the pixel control signal ϕRST, and the pixel control signal ϕSEL) for outputting (reading) the pixel signal of the pixel 11 of the corresponding row to the pixel signal output line VPix and outputs the generated pixel control signals.

In the pixel control circuit 30 shown in FIG. 5, the pixel control circuit units 301 corresponding to the pixels 11 of the rows arranged in the pixel array unit 10 are configured to be sequentially arranged in the order of the rows of the pixels 11. In the pixel control circuit 30 having the configuration shown in FIG. 5, for control from the control signal generation circuit 20, a reading timing signal is input to the pixel control circuit unit 301 of the first stage. When a pixel control signal for controlling the pixel 11 of the corresponding row is generated and output in accordance with the reading timing signal, the pixel control circuit unit 301 of the first stage outputs the input reading timing signal to the pixel control circuit unit 301 of the next stage. Thereby, the pixel control circuit unit 301 of the next stage generates and outputs a pixel control signal for controlling the pixel 11 of the corresponding row in accordance with the reading timing signal input from the pixel control circuit unit 301 of the first stage and further outputs a reading timing signal to the pixel control circuit unit 301 of the next stage. Thereafter, the pixel control circuit unit 301 of a subsequent stage generates and outputs a pixel control signal for controlling the pixel 11 of the corresponding row in accordance with the reading timing signal input from the pixel control circuit unit 301 of a previous stage, and further outputs the reading timing signal to the pixel control circuit unit 301 of a subsequent stage.

According to the above-described configuration and operation, the pixel control circuit 30 shown in FIG. 5 controls the outputting (reading) of the pixel signal from the pixel 11 to the pixel signal output line VPix for each row of the pixels 11 arranged in the pixel array unit 10. In other words, the configuration of the pixel control circuit 30 shown in FIG. 5 is a configuration of a so-called shift register in which the reading timing signal is sequentially transferred (shifted) to the pixel control circuit unit 301 of the subsequent stage.

As described above, the vertical pixel control signal line VPcnt for transferring each pixel control signal output from the pixel control circuit 30 is wired along the column direction (the vertical direction) of the pixel array unit 10 within the pixel array unit immediate region FPdown within the second semiconductor substrate 200. That is, as shown in FIG. 5, each of the three pixel control signals generated by each pixel control circuit unit 301 is transferred along the column direction (the vertical direction) of the pixel array unit 10 through the corresponding vertical pixel control signal line VPcnt.

In the first arrangement example, as shown in FIG. 5, the pixel control signal line connection electrode 320 is arranged at a position where each vertical pixel control signal line VPcnt intersects the corresponding horizontal pixel control signal line HPcnt. Thereby, in the solid-state imaging device 1, the corresponding vertical pixel control signal line VPcnt and the corresponding horizontal pixel control signal line HPcnt are electrically connected by each pixel control signal line connection electrode 320.

More specifically, the pixel control circuit 30 having the configuration shown in FIG. 5 is assumed to have a configuration in which the pixel control circuit units 301 corresponding to a first row, a second row, ..., a tenth row in order from the left side to the right side are arranged. Also, in the first semiconductor substrate 100, the rows of the pixels 11 arranged in the pixel array unit 10 are assumed to be the first row, the second row, . . . , the tenth row from the lower side to the upper side.

In this configuration, the pixel control signal line connection electrode 320 corresponding to the first row is arranged (formed) at a position where the vertical pixel control signal line VPcnt corresponding to each of the three pixel control signals generated and output by the pixel control circuit unit 301 corresponding to the first row intersects the horizontal pixel control signal line HPcnt corresponding to the pixel 11 of the first row. By the pixel control signal line connection electrode 320 corresponding to the first row, the vertical pixel control signal line VPcnt corresponding to the first row and the horizontal pixel control signal line HPcnt corresponding to the first row are electrically connected.

Also, the pixel control signal line connection electrode 320 corresponding to the second row is arranged (formed) at a position where the vertical pixel control signal line VPcnt corresponding to each of the three pixel control signals generated and output by the pixel control circuit unit 301 corresponding to the second row intersects the horizontal pixel control signal line HPcnt corresponding to the pixel 11 of the second row. By the pixel control signal line connection electrode 320 corresponding to the second row, the vertical pixel control signal line VPcnt corresponding to the second row and the horizontal pixel control signal line HPcnt corresponding to the second row are electrically connected.

Thereafter, likewise, the pixel control signal line connection electrode 320 corresponding to each row is arranged (formed) at a position where the vertical pixel control signal line VPcnt and the horizontal pixel control signal line HPcnt corresponding to each row intersect, so that the vertical pixel control signal line VPcnt and the horizontal pixel control signal line HPcnt corresponding to each row are electrically connected together.

Thereby, in the first arrangement example, as shown in FIG. 5, the pixel control signal line connection electrode 320 corresponding to each row is arranged (formed) to be shifted obliquely upward to the right and the vertical pixel control signal line VPcnt and the horizontal pixel control signal line HPcnt corresponding to each row are electrically connected together.

In this manner, in the solid-state imaging device 1, each of the three pixel control signals generated and output by each pixel control circuit unit 301 and transferred through the corresponding vertical pixel control signal line VPcnt is transferred to the corresponding horizontal pixel control signal line HPcnt via each corresponding pixel control signal line connection electrode 320 and input to the corresponding pixel 11. Thereby, in the solid-state imaging device 1, the pixel 11 arranged in each row outputs the pixel signal to the pixel signal output line VPix in accordance with the pixel control signal output from the pixel control circuit 30 and the pixel signal is input to the corresponding column signal processing circuit 50 via the pixel signal line connection electrode 310 arranged within the pixel signal line connection region FPsig. Then, the horizontal reading control circuit 40 reads the processed pixel signal (the output signal) output by each column signal processing circuit 50 performing processing such as noise suppression and AD conversion for each column and output signals of the columns are sequentially output from the output circuit 60 to outside of the solid-state imaging device 1.

According to the first embodiment of the present invention, a solid-state imaging device (the solid-state imaging device 1) includes a first semiconductor substrate (the first semiconductor substrate 100) having a pixel array unit (the pixel array unit 10) in which a plurality of pixels (pixels 11) configured to convert incident light into pixel signals are arranged in a two-dimensional matrix; a second semiconductor substrate (the second semiconductor substrate 200) stacked on a surface of a side opposite to a side on which the light is incident in the first semiconductor substrate 100 and on which a pixel control circuit (the pixel control circuit 30) configured to output pixel control signals (for example, the pixel control signal φTX, the pixel control signal φRST, and the pixel control signal φSEL) for controlling reading of the pixel signals from the pixels 11 and a reading circuit (the horizontal reading control circuit 40, the column signal processing circuit 50, the output circuit 60, and the like) configured to output each output signal obtained by processing each of the read pixel signals (the pixel signal obtained by performing a process such as noise suppression, signal amplification, or AD conversion) are arranged; and a plurality of connection electrodes (the chip connection electrodes 300, particularly, pixel control signal line connection electrodes 320) corresponding to pixel control signal lines (the pixel control signal lines Pcnt) through which the pixel control signals are transferred and configured to electrically connect the corresponding pixel control signal lines Pcnt between the first semiconductor substrate 100 and the second semiconductor substrate 200, wherein substantially all circuit elements of the pixel control circuit 30 and the reading circuit (at least the horizontal reading control circuit 40 and the column signal processing circuit 50) are arranged within a pixel immediate region (the pixel array unit immediate region FPdown) which overlaps a region where the pixel array unit 10 is arranged on the first semiconductor substrate 100 when viewed from the side on which the light is incident, wherein each of the pixel control signal line connection electrodes 320 electrically connects together a first pixel control signal line (the horizontal pixel control signal line HPcnt), which is the pixel control signal line Pcnt wired in the first semiconductor substrate 100, and a second pixel control signal line (the vertical pixel control signal line VPcnt), which is the pixel control signal line Pcnt wired in the second semiconductor substrate 200 within the pixel array unit immediate region FPdown, and wherein the pixel control circuit 30 is arranged along an edge of the pixels 11 in a row direction arranged in the pixel array unit 10 in the pixel array unit immediate region FPdown.

Also, according to the first embodiment of the present invention, the solid-state imaging device 1 in which the pixel control circuit 30 includes a plurality of pixel control circuit units (the pixel control circuit units 301) corresponding to each row of the pixels 11 arranged in the pixel array unit 10 and configured to output the pixel control signals for reading the pixel signals from the pixels 11 from the corresponding rows is configured.

Also, according to the first embodiment of the present invention, the solid-state imaging device 1 in which each of the pixel control circuit units 301 are sequentially arranged in an order of rows of the corresponding pixels 11 within a region of the pixels 11 arranged in the pixel array unit 10 along the row direction, the horizontal pixel control signal line HPcnt is wired along the row direction of the pixels 11 arranged in the pixel array unit 10 in common to the pixels 11 arranged in the same row, the vertical pixel control signal line VPcnt is wired along the column direction of the pixels 11 arranged in the pixel array unit 10 from a position at which the corresponding pixel control circuit unit 301 is arranged, and each of the pixel control signal line connection electrodes 320 is arranged at a position where the corresponding horizontal pixel control signal line HPcnt intersects the corresponding vertical pixel control signal line VPcnt and distances to the pixel control signal line connection electrodes 320 connected to the plurality of pixel control circuit units 301 differ according to each row of corresponding pixels 11 is configured.

As described above, in the solid-state imaging device 1 according to the first embodiment, as shown in the first arrangement example, the pixel array unit 10 is arranged on the first semiconductor substrate 100. Also, in the solid-state imaging device 1 of the first embodiment, as shown in the first arrangement example, the control signal generation circuit 20, the pixel control circuit 30, the horizontal reading control circuit 40, the column signal processing circuit 50, and the output circuit 60 are arranged within the pixel array unit immediate region FPdown in the second semiconductor substrate 200 serving as the side below the pixel array unit 10 arranged on the first semiconductor substrate 100. At this time, in the solid-state imaging device 1 of the first embodiment, as shown in the first arrangement example, the region where the pixel control circuit 30 is arranged is defined as a region with a shape along the row direction (the horizontal direction) of the pixel array unit 10, and the vertical pixel control signal line VPcnt corresponding to each pixel control signal output by the pixel control circuit 30 is wired along the column direction (the vertical direction) of the pixel array unit 10. In the solid-state imaging device 1 of the first embodiment, as shown in the first arrangement example, within the pixel array unit immediate region FPdown, the horizontal pixel control signal line HPcnt and the vertical pixel control signal line VPcnt are electrically connected by the pixel control signal line connection electrode 320 arranged (formed) at a position where the horizontal pixel control signal line HPcnt wired along the row direction (the horizontal direction) of the pixel array unit 10 in the first semiconductor substrate 100 intersects the vertical pixel control signal line VPcnt.

Thereby, in the solid-state imaging device 1 of the first embodiment, both the pixel control circuit 30 and the column signal processing circuit 50 of which only one can be arranged in conventional solid-state imaging devices can be arranged within the pixel array unit immediate region FPdown serving as the side below the pixel array unit 10 and each pixel control signal output by the pixel control circuit 30 arranged on the second semiconductor substrate 200 can be input to the corresponding pixel 11 arranged on the first semiconductor substrate 100. Thereby, in the solid-state imaging device 1, it is possible to reduce the size of the projection area of the solid-state imaging device 1. More specifically, the projection area of the solid-state imaging device 1 is possible to be reduced to substantially the same size as a size of the region of the pixel array unit 10 arranged on the first semiconductor substrate 100.

In an example of the arrangement of the chip connection electrodes (the pixel control signal line connection electrodes 320) in the first arrangement example of the solid-state imaging device 1 shown in FIG. 5, a case in which the pixel control signal line connection electrodes 320 corresponding to the rows are arranged (formed) to be moved (shifted) obliquely upward to the right is shown. However, the arrangement of the pixel control signal line connection electrodes 320 in the solid-state imaging device 1 is not limited to the arrangement shown in FIG. 5. For example, in the solid-state imaging device 1, the pixel control signal line connection electrodes 320 may be arranged (formed) to be moved (shifted) obliquely downward to the right.

Also, in the first arrangement example of the solid-state imaging device 1 shown in FIG. 5, a case in which lengths of wiring of the vertical pixel control signal lines VPcnt are set to be the same so that loads for the pixel control circuit units 301 are set to be the same is shown. However, the length of wiring of the vertical pixel control signal line VPcnt in the solid-state imaging device 1 is not limited to the length shown in FIG. 5. For example, the length of the wiring of the vertical pixel control signal line VPcnt of each pixel control circuit unit 301 may be a length up to the pixel control signal line connection electrode 320. In this case, although the load of the vertical pixel control signal line VPcnt changes for each pixel control circuit unit 301, output driving capability in each pixel control circuit unit 301 may be adjusted in accordance with a length of wiring (a wiring length) of the vertical pixel control signal line VPcnt.

Also, a configuration in which the pixel control circuit 30 in the first arrangement example of the solid-state imaging device 1 shown in FIG. 5 controls reading of the pixel signal from the pixel 11 to the pixel signal output line VPix for each row by sequentially transferring (shifting) the reading timing signal output by the control signal generation circuit 20 to the pixel control circuit unit 301 of the subsequent stage is shown. However, the configuration in which the pixel control circuit 30 controls the pixels 11 for each row may be a configuration different from the configuration shown in FIG. 5, i.e., the configuration of the shift register.

Second Embodiment

Next, a second embodiment of the present invention will be described. An overview, a schematic configuration, and a pixel configuration of a solid-state imaging device according to the second embodiment of the present invention (hereinafter referred to as "solid-state imaging device 2") are similar to the overview, the schematic configuration, and the pixel configuration of the solid-state imaging device 1 according to the first embodiment shown in FIG. 1 to FIG. 3. Accordingly, in the following description, the same reference signs are used for components of the solid-state imaging device 2 similar to those of the solid-state imaging device 1 of the first embodiment and a detailed description of the components and operations will be omitted.

(Example of Arrangement of Circuit Elements)

Next, an example of an arrangement of circuit elements in the solid-state imaging device 2 (hereinafter referred to as a "second arrangement example") will be described. Also, in the solid-state imaging device 2, as in the solid-state imaging device 1 of the first embodiment, each circuit elements are arranged on either one of a first semiconductor substrate 100 and a second semiconductor substrate 200.

Components (circuit elements) and wiring of signal lines arranged on the first semiconductor substrate 100 in the second arrangement example are similar to those arranged on the solid-state imaging device 1 of the first embodiment shown in (a) of FIG. 4 in the first arrangement example. That is, in the second arrangement example, the pixel array unit 10 is arranged on the first semiconductor substrate 100 and the horizontal pixel control signal line HPcnt and the pixel signal output line VPix are similarly wired. Also, components (circuit elements) and wiring of signal lines arranged on the second semiconductor substrate 200 in the second arrangement example are similar to those arranged on the solid-state imaging device 1 of the first embodiment shown in (b) of FIG. 4 in the first arrangement example. That is, in the second arrangement example, on the second semiconductor substrate 200, a control signal generation circuit 20, a pixel control circuit 30, a horizontal reading control circuit 40, a column signal processing circuit 50, and an output circuit 60 are arranged within a pixel array unit immediate region FPdown and a vertical pixel control signal line VPcnt is similarly wired. At this time, in the second arrangement, as in the first arrangement example of the solid-state imaging device 1 of the first embodiment shown in (b) of FIG. 4, the pixel control circuit 30 is arranged in a region of a laterally elongated shape having a width of the pixel array unit 10 in a row direction along an edge of the pixel array unit 10 in the row direction at an opposite side of a pixel signal line connection region FPsig in a pixel array unit immediate region FPdown.

In the second arrangement example, as in the first arrangement example of the solid-state imaging device 1 of the first embodiment, the pixel signal output line VPix is connected between the first semiconductor substrate 100 and the second semiconductor substrate 200 by a pixel signal line connection electrode 310 formed in the pixel signal line connection region FPsig. Also, in the second arrangement example, as in the first arrangement example in the solid-state imaging device 1 of the first embodiment, three pixel control signals output by the pixel control circuit 30 arranged on the second semiconductor substrate 200 are connected to the corresponding pixels 11 arranged on the first semiconductor substrate 100 by a pixel control signal line connection electrode 320 formed within the pixel array unit immediate region FPdown.

Accordingly, in the description of the second arrangement example of the solid-state imaging device 2, a detailed description of the arrangement of the components (the circuit elements) and the wiring of the signal lines in each of the first semiconductor substrate 100 and the second semiconductor substrate 200 will be omitted.

In the second arrangement example of the solid-state imaging device 2, an arrangement of pixel control signal line connection electrodes 320 configured to electrically connect the horizontal pixel control signal line HPcnt and the vertical pixel control signal line VPcnt between the first semiconductor substrate 100 and the second semiconductor substrate 200 is different from the first arrangement example of the solid-state imaging device 1 of the first embodiment shown in FIG. 5. Accordingly, in description of the second arrangement example, the arrangement of the pixel control signal line connection electrodes 320 will be described.

Figure 6:
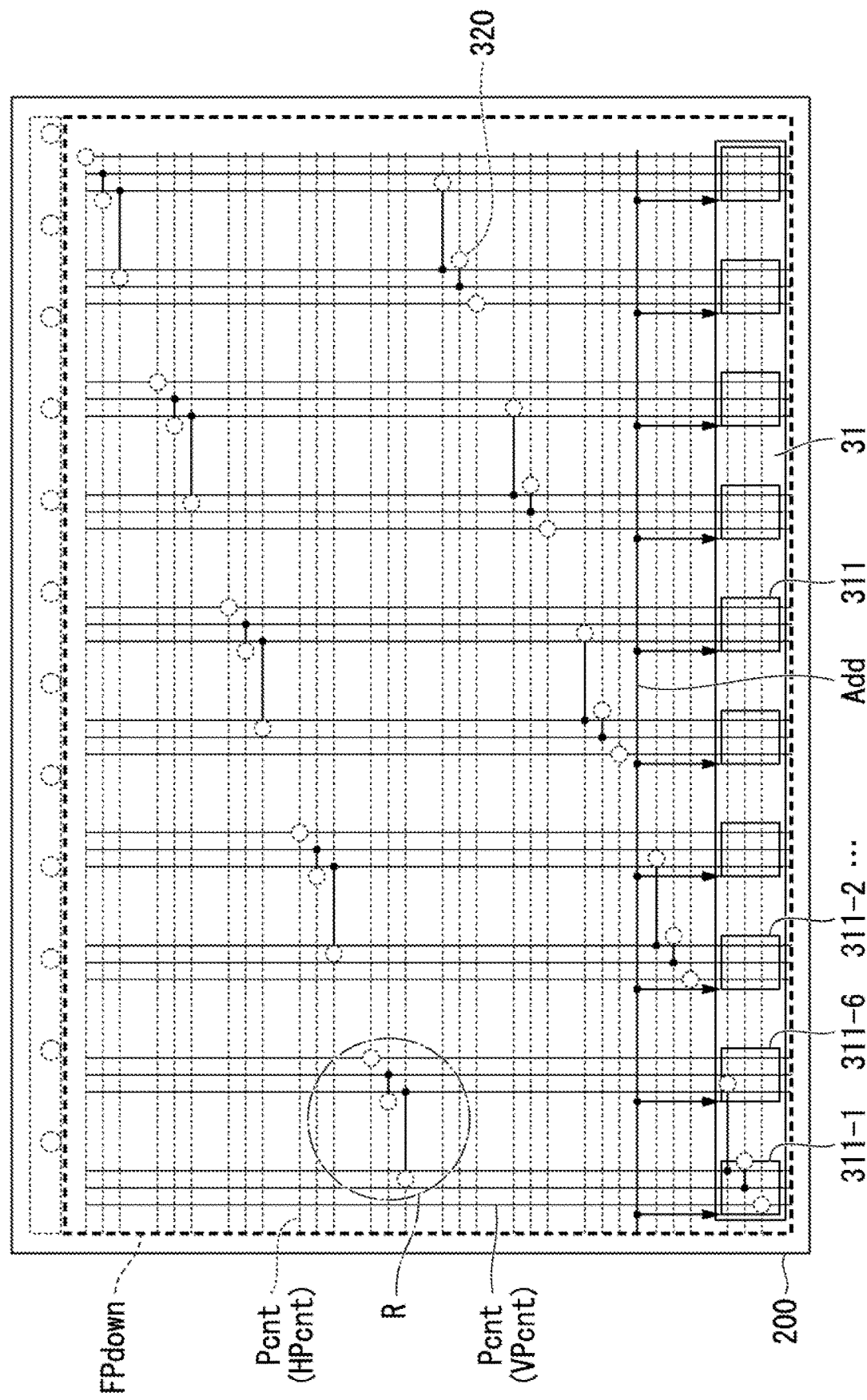
FIG. 6 is a diagram schematically showing an example of an arrangement of chip connection electrodes in a second semiconductor substrate of a solid-state imaging device according to a second embodiment of the present invention.

FIG. 6 is a diagram schematically showing an example of an arrangement of chip connection electrodes (the pixel control signal line connection electrodes 320) in the second semiconductor substrate 200 of the solid-state imaging device 2 according to the second embodiment of the present invention. In FIG. 6, as in the first arrangement example of the solid-state imaging device 1 of the first embodiment shown in FIG. 5, an example of the arrangement of the pixel control signal line connection electrodes 320 in the second semiconductor substrate 200 is shown. Also, in FIG. 6, as in the first arrangement example of the solid-state imaging device 1 of the first embodiment shown in FIG. 5, a horizontal pixel control signal line HPcnt wired along the row direction (the horizontal direction) of the pixel array unit 10 within the first semiconductor substrate 100 to transfer the pixel control signal to each pixel 11 is indicated by a dotted line.

In the solid-state imaging device 2, the configuration of the pixel control circuit 30 is different from that of the pixel control circuit 30 provided in the solid-state imaging device 1 of the first embodiment. In the following description, the pixel control circuit 30 provided in the solid-state imaging device 2 is referred to as a "pixel control circuit 31". In FIG. 6, a plurality of pixel control circuit units 311 provided in the pixel control circuit 31 and configured to generate a pixel control signal to be output to the pixel 11 of the corresponding row is shown.

The pixel control circuit 31 decodes a read address signal indicating a row of the pixel 11 from which the pixel signal is read to determine the address value and outputs three pixel control signals (the pixel control signal ϕTX, the pixel control signal ϕRST, and the pixel control signal ϕSEL) for controlling the pixel 11 of the row corresponding to the determined address value. In other words, the pixel control circuit 31 has a configuration of a so-called address decoder configured to decode the read address signal. Thus, as shown in FIG. 6, in the pixel control circuit 31, for control from the control signal generation circuit 20, the read address signal transferred through a read address signal line Add is input to the pixel control circuit unit 311.

In each of the pixel control circuit units 311, different address values indicating the rows of the pixels 11 from which pixel signals are read are predetermined. Each of the pixel control circuit units 311 decodes the input read address signal, and generates and outputs the three pixel control signals for outputting (reading) the pixel signal from the pixel 11 of the corresponding row to the pixel signal output line Vpix if the address value indicated by the read address signal is a predetermined address value. In the pixel control circuit 31, each pixel control circuit unit 311 decodes the input read address signal to determine the address value and any pixel control circuit unit 311 corresponding to the address value indicated by the read address signal generates and outputs three pixel control signals. In FIG. 6, after "-" following the reference numeral of each pixel control circuit unit 311, a number indicating the row of the corresponding pixel 11 is shown. For example, the pixel control circuit unit 311 for controlling each pixel 11 of the first row is referred to as a "pixel control circuit unit 311-1" by attaching "1" indicating the pixel 11 of the first row after "-" following the reference numeral.

In the pixel control circuit 31, the pixel control circuit units 311 are arranged so that the pixel control circuit units 311 corresponding to the pixels 11 of adjacent rows arranged in the pixel array unit 10 are not adjacent to each other. That is, in the pixel control circuit 31 provided in the pixel control circuit 31, the pixel control circuit units 311 corresponding to the pixels 11 of the rows are arranged so that they are not in an order of the rows of the pixels 11. This method of arranging the pixel control circuit units 311 in the pixel control circuit 31 can be implemented because it may be unnecessary for the pixel control circuit 31 to sequentially transfer (shift) reading timing signals as in the pixel control circuit 30 of the configuration of the shift register shown in FIG. 5. That is, as described above, this is an arrangement method capable of being implemented because the pixel control circuit 31 is configured to control each pixel 11 arranged in the pixel array unit 10 for each row according to an address value obtained as a result of decoding the read address signal in each pixel control circuit unit 311. Even when the pixel control circuit units 311 are arranged so that they are not in the order of the rows of the pixels 11 in the pixel control circuit 31, the control signal generation circuit 20 outputs a read address signal for sequentially controlling the pixels 11 for each row (for example, a read address signal whose address value is incremented once at a time), so that the pixel control circuit 31 can sequentially control the pixels 11 for each row.

In FIG. 6, the pixel control circuit 31 having a configuration in which the pixel control circuit units 311 corresponding to the first row, the sixth row, the second row, . . . are arranged from the left side to the right side is shown. Even when the pixel control circuit 31 has such a configuration, the control signal generation circuit 20 outputs reading address signals sequentially indicating the first row, the second row, . . . , the tenth row, so that the pixel control circuit 31 can sequentially output pixel control signals for sequentially controlling the pixels 11 of the first row, the second row, . . . , the tenth row for each row. This is because each pixel control circuit unit 311 generates and outputs a pixel control signal for controlling the pixel 11 of the corresponding row if an address value obtained as a result of decoding an input reading address signal indicates the row of the pixel 11 corresponding to the pixel control circuit unit 311 itself regardless of a position where the pixel control circuit unit 311 is arranged within the pixel control circuit 31.

According to the above-described configuration and operation, the pixel control circuit 31 shown in FIG. 6 controls the outputting (reading) of the pixel signal from the pixel 11 to the pixel signal output line VPix for each row of the pixels 11 arranged in the pixel array unit 10.

As described above, in the second arrangement example, as in the first arrangement example of the solid-state imaging device 1 of the first embodiment, the vertical pixel control signal line VPcnt for transferring each pixel control signal output from the pixel control circuit 31 is arranged along the column direction (the vertical direction) of the pixel array unit 10 within the pixel array unit immediate region FPdown within the second semiconductor substrate 200. That is, in the second arrangement example, as shown in FIG. 6, each of the three pixel control signals generated by each pixel control circuit unit 311 is transferred along the column direction (the vertical direction) of the pixel array unit 10 through the corresponding vertical pixel control signal line VPcnt.

In the second arrangement example, as in the first arrangement example of the solid-state imaging device 1 of the first embodiment, the vertical pixel control signal line VPcnt and the horizontal pixel control signal line HPcnt are electrically connected at a position where each vertical pixel control signal line VPcnt intersects a corresponding horizontal pixel control signal line HPcnt.

In this case, in the second arrangement example, as shown in FIG. 6, the pixel control signal line connection electrode 320 is arranged at a position different from the position where the vertical pixel control signal line VPcnt and the horizontal pixel control signal line HPcnt intersect. That is, in the second arrangement example, the pixel control signal line connection electrode 320 may not be necessarily arranged at a position where the vertical pixel control signal line VPcnt and the horizontal pixel control signal line HPcnt intersect. In the second arrangement example, the pixel control signal line connection electrodes 320 corresponding to at least two pixel control signals among the three pixel control signals generated by each pixel control circuit unit 311 are arranged at a position moved (shifted) to the pixel array unit 10 in the row direction (the horizontal direction) along the horizontal pixel control signal line HPcnt. Also, in this case, in the second arrangement example, the corresponding vertical pixel control signal line VPcnt and the corresponding horizontal pixel control signal line HPcnt are electrically connected by the pixel control signal line connection electrode 320.

For example, the arrangement of the pixel control signal line connection electrodes 320 at a position of a range R encircled by a dot-and-dash line circle in FIG. 6 may be conceived. More specifically, the arrangement of the pixel control signal line connection electrodes 320 for electrically connecting each of the three vertical pixel control signal lines VPcnt configured to transfer the three pixel control signals generated and output by the pixel control circuit unit 311-6 corresponding to the pixel 11 of the sixth row to the corresponding horizontal pixel control signal line HPcnt may be conceived.

Each of the three vertical pixel control signal lines VPcnt corresponding to the pixel control circuit unit 311-6 is electrically connected by the pixel control signal line connection electrode 320 at a position where the vertical pixel control signal line VPcnt intersects the horizontal pixel control signal line HPcnt corresponding to the pixel 11 of the sixth row. At this time, the pixel control signal line connection electrodes 320 configured to connect the two vertical pixel control signal lines VPcnt among the three vertical pixel control signal lines VPcnt to the corresponding horizontal pixel control signal lines HPcnt are arranged (formed) at a position moved (shifted) to the pixel array unit 10 in the row direction (the horizontal direction) along the horizontal pixel control signal line HPcnt. Accordingly, in the second arrangement example, an interval between the pixel control signal line connection electrodes 320 arranged (formed) adjacent to each other, i.e., a pitch between the pixel control signal line connection electrodes 320, can be set to be wider than when the pixel control signal line connection electrode 320 is arranged (formed) at a position where the vertical pixel control signal line VPcnt and the horizontal pixel control signal line HPcnt intersect. That is, the pitch between the pixel control signal line connection electrodes 320 in the second arrangement example can be set to be wider than the pitch between the pixel control signal line connection electrodes 320 in the first arrangement example of the solid-state imaging device 1 shown in FIG. 5.

By increasing the pitch between the pixel control signal line connection electrodes 320, in the second arrangement example, it is possible to improve the reliability of the connection of the vertical pixel control signal line VPcnt and the horizontal pixel control signal line HPcnt by the pixel control signal line connection electrode 320 when the solid-state imaging device 2 is manufactured as compared with the first arrangement example in the solid-state imaging device 1 of the first embodiment.

In FIG. 6, a black circle shown at a position where the vertical pixel control signal line VPcnt and the horizontal pixel control signal line HPcnt intersect indicates a position at which wiring for moving (shifting) a position of the pixel control signal line connection electrode 320 (a thick solid line in FIG. 6) is connected to the vertical pixel control signal line VPcnt wired along the column direction (the vertical direction) of to the pixel array unit 10.

Figure 7:
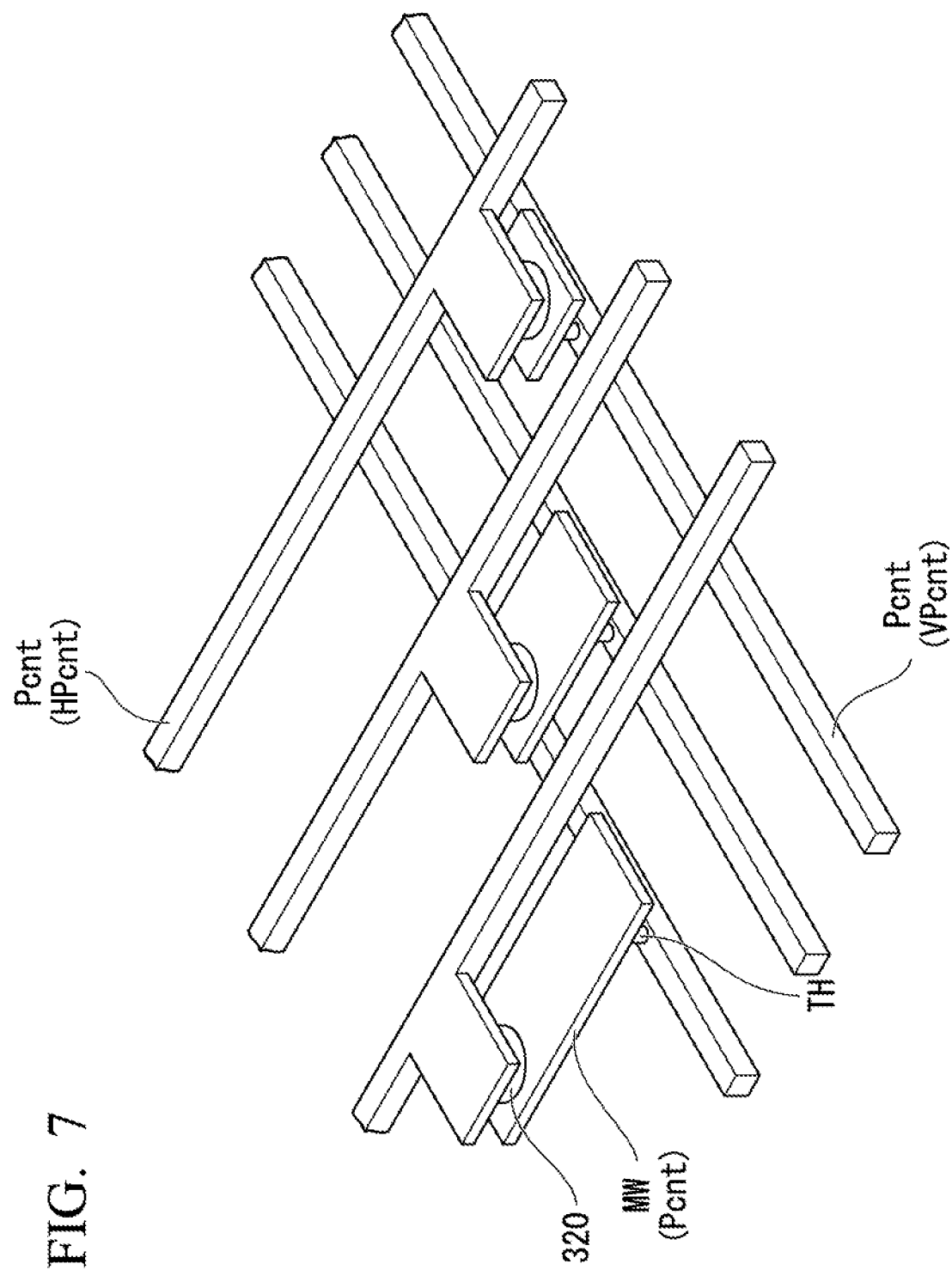
FIG. 7 is a diagram schematically showing an example of a structure around the chip connection electrodes in the solid-state imaging device according to the second embodiment of the present invention.

A structure of the solid-state imaging device 2 at a position of the range R encircled by the circle of the dot-and-dash line in FIG. 6 will be described. FIG. 7 is a diagram schematically showing an example of a structure around the chip connection electrodes (the pixel control signal line connection electrodes 320) in the solid-state imaging device 2 according to the second embodiment of the present invention. In FIG. 7, an example of a structure in which a position where each pixel control signal line connection electrode 320 is formed is moved (shifted) to the pixel array unit 10 in the row direction (the horizontal direction) by using a wiring layer above the wiring layer for wiring (forming) the vertical pixel control signal line VPcnt in the second semiconductor substrate 200 is shown.

As shown in FIG. 7, in the second arrangement example of the solid-state imaging device 2, in the second semiconductor substrate 200, a chip connection electrode movement signal line MW for moving (shifting) a position where the pixel control signal line connection electrode 320 is formed on the pixel array unit 10 in the row direction (the horizontal direction) is formed on the wiring layer above the wiring layer for wiring (forming) the vertical pixel control signal line VPcnt. Also, the chip connection electrode movement signal line MW is a part of the signal line constituting the pixel control signal line (the pixel control signal line Pcnt). In the second arrangement example, in the second semiconductor substrate 200, the corresponding vertical pixel control signal line VPcnt is connected to the chip connection electrode movement signal line MW through an intra-substrate connection electrode TH which is referred to as a so-called VIA, a contact, or the like for connecting different wiring layers. According to such a structure, in the second semiconductor substrate 200, the vertical pixel control signal line VPcnt and the corresponding pixel control signal line connection electrode 320 are connected via the intra-substrate connection electrode TH and the chip connection electrode movement signal line MW.

A direction in which a position where each pixel control signal line connection electrode 320 is formed is moved (shifted) to the pixel array unit 10 in the row direction (the horizontal direction) is not limited to the same direction. For example, as shown in FIG. 6, a direction in which the pixel control signal line connection electrode 320 is moved (shifted) may differ according to each row of the corresponding pixel 11. That is, if the pitch between the pixel control signal line connection electrodes 320 can be increased, the position where the pixel control signal line connection electrode 320 is formed may be moved (shifted) in any row direction (horizontal direction).

In the second arrangement example, as described above, the horizontal pixel control signal line HPcnt wired (formed) on the first semiconductor substrate 100 is connected to the vertical pixel control signal line VPcnt wired (formed) on the second semiconductor substrate 200, by connecting the horizontal pixel control signal line HPcnt and the pixel control signal line connection electrode 320.

According to such a structure, in the solid-state imaging device 2, each of the three pixel control signals generated and output by each pixel control circuit unit 311 provided in the pixel control circuit 31 is transferred from the corresponding vertical pixel control signal line VPcnt to the corresponding horizontal pixel control signal line HPcnt via the intra-substrate connection electrode TH, the chip connection electrode movement signal line MW, and the pixel control signal line connection electrode 320 and input to the corresponding pixels 11. Thereby, in the solid-state imaging device 2, as in the solid-state imaging device 1 of the first embodiment, the pixel 11 arranged in each row outputs the pixel signal to the pixel signal output line VPix in accordance with each pixel control signal output from the pixel control circuit 31 and the pixel signal is input to the corresponding column signal processing circuit 50 via the pixel signal line connection electrode 310 arranged within the pixel signal line connection region FPsig. Then, the horizontal reading control circuit 40 reads the processed pixel signal (the output signal) output by each column signal processing circuit 50 performing processing such as noise suppression and AD conversion for each column and output signals of the columns are sequentially output from the output circuit 60 to outside of the solid-state imaging device 2.

According to the second embodiment of the present invention, the solid-state imaging device (the solid-state imaging device 2) in which each of the pixel control circuit units (the pixel control circuit units 311) include an address decoder configured to decode an input address signal (a reading address signal) and output the pixel control signal when the address signal indicates a predetermined address value in a state in which address values different from each other are predetermined is configured.

Also, according to the second embodiment of the present invention, the solid-state imaging device (the solid-state imaging device 2) in which each of the pixel control circuit units 311 are arranged so that the pixel control circuit units 311 corresponding to the pixels 11 of adjacent rows are not adjacent to each other within the region along the row direction of the pixels (the pixels 11) arranged in the pixel array unit 10, the first pixel control signal line (the horizontal pixel control signal line HPcnt) is wired along the row direction of the pixels (the pixels 11) arranged in the pixel array unit 10 in common to the pixels 11 arranged in the same row, the second pixel control signal line (the vertical pixel control signal line VPcnt) is wired along the column direction of the pixels (the pixels 11) arranged in the pixel array unit 10 from a position at which the corresponding pixel control circuit unit 311 is arranged, and each of the connection electrodes (the chip connection electrodes 300, particularly, the pixel control signal line connection electrodes 320) is arranged at a position where the corresponding horizontal pixel control signal line HPcnt intersects the corresponding vertical pixel control signal line VPcnt and distances to the pixel control signal line connection electrodes 320 connected to the plurality of pixel control circuit units 311 differ according to each row of corresponding pixels 11 is configured.

Also, according to the second embodiment of the present invention, the solid-state imaging device 2 in which the vertical pixel control signal line VPcnt includes a third pixel control signal line (the intra-substrate connection electrode TH and the chip connection electrode movement signal line MW) wired to move a position where the corresponding pixel control signal line connection electrode 320 is arranged along the row direction of the pixels 11 arranged in the pixel array unit 10 from a position where the vertical pixel control signal line VPcnt intersects the corresponding horizontal pixel control signal line HPcnt, and each of the pixel control signal line connection electrodes 320 is electrically connected to the corresponding horizontal pixel control signal line HPcnt at a position moved by the intra-substrate connection electrode TH and the chip connection electrode movement signal line MW is configured.

As described above, in the solid-state imaging device 2 of the second embodiment, as in the solid-state imaging device 1 of the first embodiment, the pixel array unit 10 is arranged on the first semiconductor substrate 100, and the control signal generation circuit 20, the pixel control circuit 31, the horizontal reading control circuit 40, the column signal processing circuit 50, and the output circuit 60 are arranged within the pixel array unit immediate region FPdown in the second semiconductor substrate 200 serving as the side below the pixel array unit 10 arranged on the first semiconductor substrate 100. At this time, in the solid-state imaging device 2, as in the solid-state imaging device 1 of the first embodiment, the region where the pixel control circuit 31 is arranged is defined as a region with a shape along the row direction (the horizontal direction) of the pixel array unit 10, and the vertical pixel control signal line VPcnt corresponding to each pixel control signal output by the pixel control circuit 31 is wired along the column direction (the vertical direction) of the pixel array unit 10.

In the solid-state imaging device 2 of the second embodiment, as in the solid-state imaging device 1 of the first embodiment, within the pixel array unit immediate region FPdown, the horizontal pixel control signal line HPcnt and the vertical pixel control signal line VPcnt wired along the row direction (the horizontal direction) of the pixel array unit 10 in the first semiconductor substrate 100 are electrically connected by the pixel control signal line connection electrode 320. At this time, in the solid-state imaging device 2 of the second embodiment, the pitch between the pixel control signal line connection electrodes 320 is increased by arranging (forming) the pixel control signal line connection electrode 320 from a position where the horizontal pixel control signal line HPcnt and the vertical pixel control signal line VPcnt intersect to a position moved (shifted) to the pixel array unit 10 in the row direction (the horizontal direction).

Thereby, in the solid-state imaging device 2 of the second embodiment, as in the solid-state imaging device 1 of the first embodiment, both the pixel control circuit 31 and the column signal processing circuit 50 are arranged within the pixel array unit immediate region FPdown serving as the side below the pixel array unit 10, so that the projection area of the solid-state imaging device 2 is possible to be reduced. Moreover, in the solid-state imaging device 2 of the second embodiment, it is possible to improve reliability when the first semiconductor substrate 100 and the second semiconductor substrate 200 are stacked (bonded) as compared with the solid-state imaging device 1 of the first embodiment by increasing the pitch when the pixel control signal line connection electrode 320 electrically connecting the horizontal pixel control signal line HPcnt and the vertical pixel control signal line VPcnt is arranged (formed). Thereby, in the solid-state imaging device 2 of the second embodiment, it is possible to improve the yield of manufacturing the solid-state imaging device 2 as compared with the solid-state imaging device 1 of the first embodiment.

In the example of the arrangement of the chip connection electrodes (the pixel control signal line connection electrodes 320) in the second arrangement example of the solid-state imaging device 2 shown in FIG. 6, a configuration in which the pixel control circuit unit 311 corresponding to the pixel 11 of a row which is not adjacent is arranged between the pixel control circuit units 311 corresponding to the pixels 11 of adjacent rows is shown. More specifically, a configuration in which, between a pixel control circuit unit 311-1 corresponding to the first row and a pixel control circuit unit 311-2 corresponding to the second row adjacent to the pixel control circuit unit 311-1, a pixel control circuit unit 311-6 corresponding to the sixth row which is not adjacent thereto is arranged is shown. However, an order in which the pixel control circuit units 311 are arranged in the solid-state imaging device 2, i.e., an order in which the pixel control circuit units 311 are arranged within the pixel control circuit 31, is not limited to the arrangement shown in FIG. 6. For example, a configuration in which a plurality of pixel control circuit units 311 corresponding to the pixels 11 of rows which are not adjacent to each other may be arranged between the pixel control circuit units 311 corresponding to the pixels 11 of adjacent rows may be adopted. More specifically, a configuration in which a pixel control circuit unit 311-4 corresponding to the fourth row, a pixel control circuit unit 311-7 corresponding to the seventh row, a pixel control circuit unit 311-9 corresponding to the ninth row, and the like which are not adjacent to one another are arranged between the pixel control circuit unit 311-1 and the pixel control circuit unit 311-2 may be adopted.

As in the pixel control circuit 30 in the first arrangement example of the solid-state imaging device 1 shown in FIG. 4 and FIG. 5, a configuration in which the pixel control circuit 31 in the second arrangement example of the solid-state imaging device 2 shown in FIG. 6 is arranged in a region of a laterally elongated shape having a width of the pixel array unit 10 in the row direction and the horizontal pixel control signal line HPcnt and the vertical pixel control signal line VPcnt are electrically connected by the pixel control signal line connection electrode 320 formed within the pixel array unit immediate region FPdown is shown. However, although the pixel control circuit 31 has the laterally elongated shape, it may be arranged within a region having a width narrower than the width of the pixel array unit 10 in the row direction. In this case, it is conceivable that an interval (a pitch) between the vertical pixel control signal lines VPcnt corresponding to the three pixel control signals output by the pixel control circuit unit 311 provided in the pixel control circuit 31 may be narrowed. However, in the solid-state imaging device 2, because the interval (the pitch) between the pixel control signal line connection electrodes 320 can be increased according to the structure shown in FIG. 7, the pixel control circuit 31 can be arranged within a narrow width region.

First Modified Example

A second arrangement example in which the pixel control circuit 31 is arranged within a region having a width narrower than the width of the pixel array unit 10 in the row direction will be described as a first modified example. In the first modified example, components (circuit elements) and wiring of signal lines arranged on the first semiconductor substrate 100 and the second semiconductor substrate 200 are similar to those in the second arrangement example, i.e., the first arrangement example of the solid-state imaging device 1 of the first embodiment shown in (a) of FIG. 4 and (b) of FIG. 4, except that the width of the region where the pixel control circuit 31 is arranged is narrowed. Accordingly, in the description of the first modified example, a detailed description of the arrangement of the components (the circuit elements) and the wiring of the signal lines in each of the first semiconductor substrate 100 and the second semiconductor substrate 200 will be omitted and the arrangement of the pixel control signal line connection electrodes 320 will be described.

Figure 8:
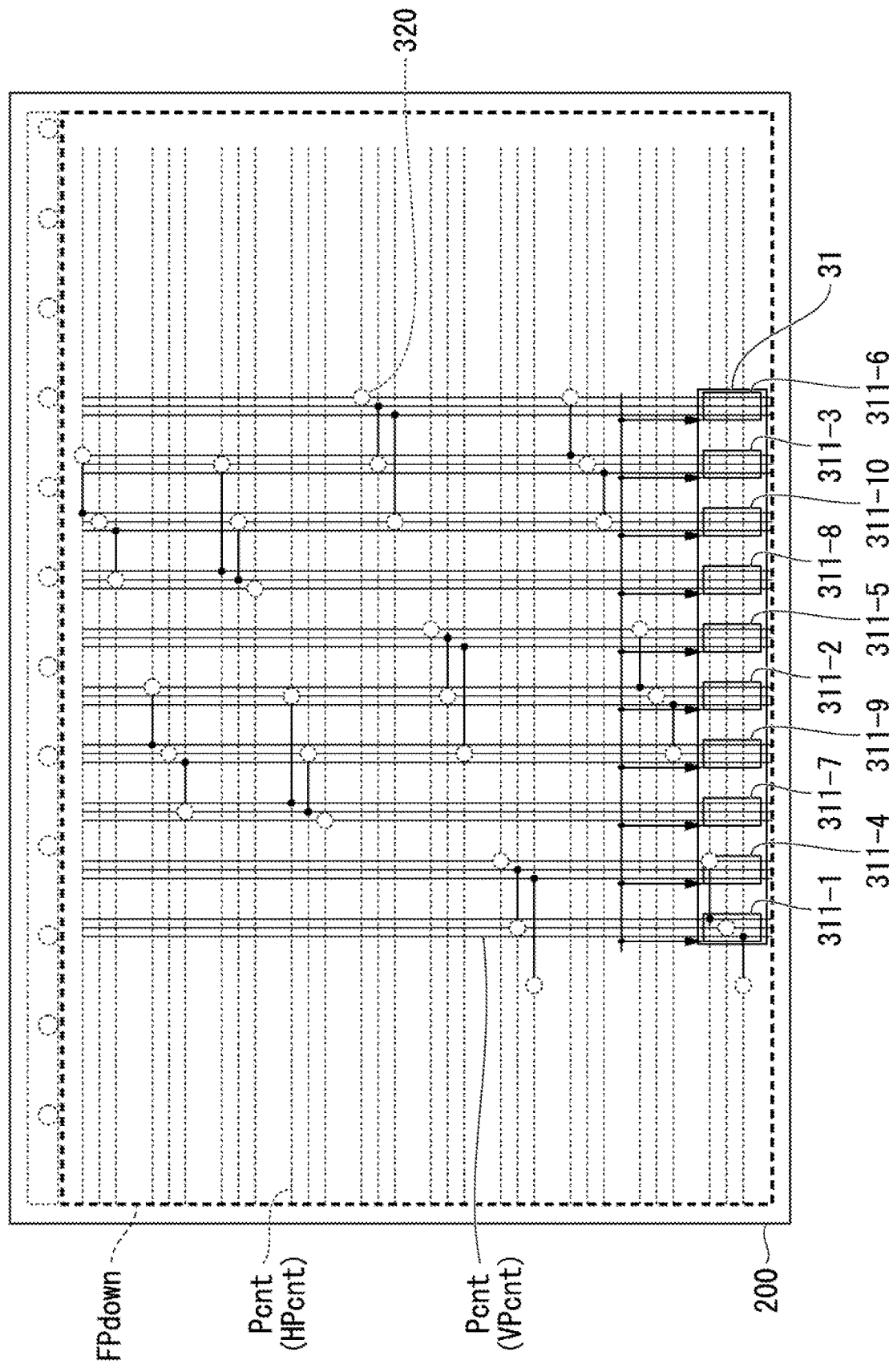
FIG. 8 is a diagram schematically showing another example of the arrangement of the chip connection electrodes in the second semiconductor substrate of the solid-state imaging device according to the second embodiment of the present invention.

FIG. 8 is a diagram schematically showing another example (the first modified example) of the arrangement of chip connection electrodes (the pixel control signal line connection electrodes 320) in the second semiconductor substrate 200 of the solid-state imaging device 2 according to the second embodiment of the present invention. In FIG. 8, as in the second arrangement example shown in FIG. 6, an example of the arrangement of the pixel control signal line connection electrodes 320 in the second semiconductor substrate 200 is shown. Also in FIG. 8, as in the second arrangement example shown in FIG. 6, the horizontal pixel control signal line HPcnt wired along the row direction (the horizontal direction) of the pixel array unit 10 within the first semiconductor substrate 100 to transfer a pixel control signal to each pixel 11 is indicated by a dotted line. Also in FIG. 8, as in the second arrangement example shown in FIG. 6, each pixel control circuit unit 311 provided in the pixel control circuit 31 is shown with a number indicating a row of the corresponding pixel 11 after "-" following the reference numeral of pixel control circuit unit 311.

Also, in the first modified example, each pixel control circuit unit 311 provided in the pixel control circuit 31 is arranged so that the pixel control circuit units 311 corresponding to the pixels 11 of the adjacent rows are not adjacent to each other. In FIG. 8, the pixel control circuit 31 having a configuration in which the pixel control circuit units 311 corresponding to the first row, the fourth row, the seventh row, the ninth row, the second row, the fifth row, the eighth row, the tenth row, the third row, and the sixth row from the left side to the right side are arranged in that order is shown.

Also, in the first modified example, the pixel control circuit 31 is arranged within a region having a width narrower than the width of the pixel array unit 10 in the row direction. In FIG. 8, a case in which the region where the pixel control circuit 31 is arranged at the center position along the row direction of the pixel array unit 10 at a position of an opposite side of the pixel signal line connection region FPsig is shown.

In the first modified example, as in the second arrangement example, in order to increase the pitch between the pixel control signal line connection electrodes 320, the pixel control signal line connection electrode 320 is arranged (formed) at a position obtained by moving (shifting) the position of the pixel control signal line connection electrode 320 in the row direction (the horizontal direction) and each of the three pixel control signals output by the pixel control circuit 31 arranged on the second semiconductor substrate 200 is connected to the corresponding pixels 11 arranged on the first semiconductor substrate 100. Thus, in the first modified example, as shown in FIG. 8, a width in the row direction in a range of a region where the pixel control signal line connection electrode 320 connecting the horizontal pixel control signal line HPcnt and the vertical pixel control signal line VPcnt is arranged (formed) also becomes narrower than the width in the row direction in the pixel array unit immediate region FPdown.

In this configuration of the pixel control circuit 31 arranged within a region having a width narrower than the width of the pixel array unit 10 in the row direction, the control signal generation circuit 20 outputs a read address signal for sequentially controlling the pixels 11 for each row and hence the pixel control circuit 31 can sequentially control each pixel 11 for each row. That is, in the first modified example, the solid-state imaging device 2 also operates as in the second arrangement example.

In the first modified example, the components provided in the solid-state imaging device 2 may be similar to those provided in the solid-state imaging device 1 of the first embodiment. That is, in the first modified example, instead of the pixel control circuit 31 which is the configuration of the address decoder provided in the solid-state imaging device 2, a configuration in which the pixel control circuit 30 which is the configuration of the shift register may be adopted.

According to the first modified example of the second embodiment of the present invention, the solid-state imaging device (the solid-state imaging device 2) in which each of the pixel control circuit units (the pixel control circuit units 311) are arranged within a region having a width narrower than the width of the pixels (the pixels 11) in the row direction arranged in the pixel array unit 10 is configured.

As described above, also in the first modified example of the solid-state imaging device 2, by arranging (forming) the pixel control signal line connection electrode 320 at a position moved (shifted) in the row direction (the horizontal direction), it is possible to improve the reliability when the first semiconductor substrate 100 and the second semiconductor substrate 200 are stacked (bonded) and implement reduction of the projection area of the solid-state imaging device 2. Moreover, in the solid-state imaging device 2 of the first modified example, the pixel control circuit 31 is arranged in a region having a width narrower than the width of the pixel array unit 10 in the row direction, so that a width in the row direction in a range of a region where the pixel control signal line connection electrode 320 is arranged (formed) is narrowed. Thus, in the solid-state imaging device 2 of the first modified example, a free region other than the range in which the pixel control signal line connection electrode 320 is arranged (formed) in the pixel array unit immediate region FPdown can be used as a region for achieving a purpose other than the connection of the horizontal pixel control signal line HPcnt and the vertical pixel control signal line VPcnt such as a region for arranging other components or a region for forming wiring for connecting other signal lines in the solid-state imaging device 2.

In the first modified example of the second arrangement example of the solid-state imaging device 2 shown in FIG. 8, a case in which the region where the pixel control circuit 31 is arranged is arranged at the center of the pixel array unit 10 along the row direction at a position of an opposite side of the pixel signal line connection region FPsig is shown. However, in order to more effectively use a free region other than the region where the pixel control signal line connection electrode 320 is arranged (formed), it is more preferable that the region where the pixel control circuit 31 is arranged be arranged at either end of the pixel array unit 10 along the row direction, i.e., a position close to other than the center thereof, instead of the center of the pixel array unit 10 along the row direction.

Second Modified Example

Figure 9:
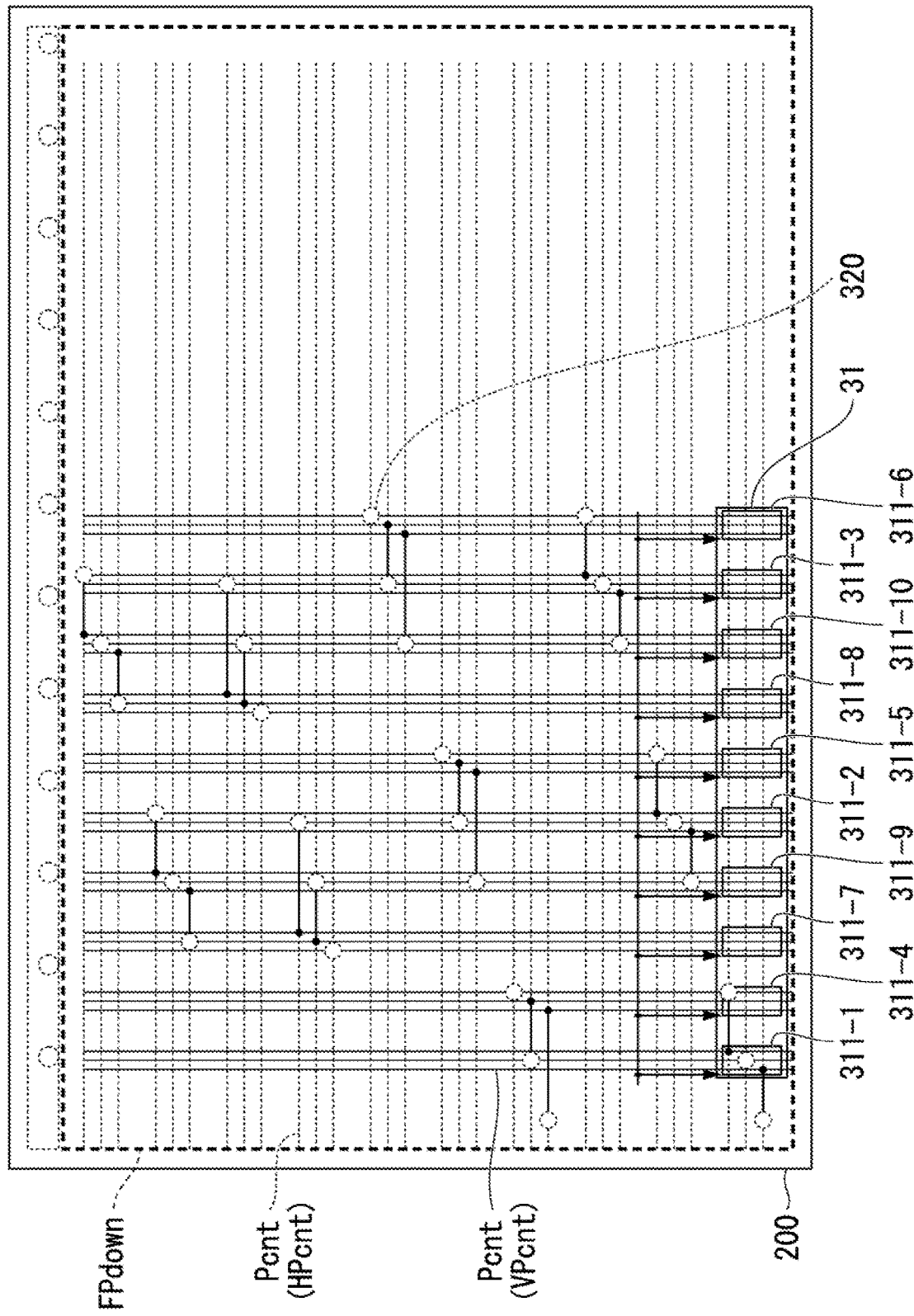
FIG. 9 is a diagram schematically showing still another example of the arrangement of the chip connection electrodes in the second semiconductor substrate of the solid-state imaging device according to the second embodiment of the present invention.

A second arrangement example in which a region of the pixel control circuit 31 arranged with a width narrower than a width of the pixel array unit 10 in the row direction is arranged close to a position other than the center of the pixel array unit 10 along the row direction will be described as a second modified example. FIG. 9 is a diagram schematically showing still another example (the second modified example) of an arrangement of chip connection electrodes (the pixel control signal line connection electrodes 320) in the second semiconductor substrate 200 of the solid-state imaging device 2 according to the second embodiment of the present invention. In FIG. 9, as in the first modified example of the solid-state imaging device 2 shown in FIG. 8, an example of the arrangement of the pixel control signal line connection electrodes 320 in the second semiconductor substrate 200 is shown.

In the second modified example, a case in which a region where the pixel control circuit 31 having a width narrower than the width of the pixel array unit 10 in the row direction is arranged is arranged at a position close to the left side of the pixel array unit 10 in the row direction (a position of a side at which the pixel 11 of the first column in the first row is arranged in the pixel array unit 10) at a position of the opposite side of the pixel signal line connection region FPsig is shown.

Also in the second modified example, the components (circuit elements) and the wiring of the signal lines arranged on the first semiconductor substrate 100 and the second semiconductor substrate 200, the arrangement of the pixel control circuit units 311 within the pixel control circuit 31, and the arrangement of the pixel control signal line connection electrodes 320, i.e., a method of increasing a pitch between the pixel control signal line connection electrodes 320, can be conceived as in the first modified example. Also, in the second modified example, the solid-state imaging device 2 operates as in the first modified example.

Also in the second modified example, as in the first modified example, the components provided in the solid-state imaging device 2 may be similar to those provided in the solid-state imaging device 1 of the first embodiment. That is, even when the pixel control circuit 31 having a width narrower than the width of the pixel array unit 10 in the row direction is arranged close to a position other than the center of the pixel array unit 10 along the row direction, the solid-state imaging device 2 may be configured to include the pixel control circuit 30 which is the configuration of the shift register instead of the pixel control circuit 31 which is the configuration of the address decoder.

According to the second modified example of the second embodiment of the present invention, a solid-state imaging device (the solid-state imaging device 2) in which a narrow width region where each of the pixel control circuit units (the pixel control circuit units 311) is arranged is located close to one end or both ends in the row direction of the pixels (the pixels 11) arranged in the pixel array unit 10 is configured.

As described above, also, in the second modified example of the solid-state imaging device 2, as in the second arrangement example and the first modified example, it is possible to improve the reliability when the first semiconductor substrate 100 and the second semiconductor substrate 200 are stacked (bonded) and implement reduction of the projection area of the solid-state imaging device 2. Moreover, in the second modified example, because the region where the pixel control circuit 31 is arranged is positioned at the left side of the pixel array unit 10 in the row direction, a free region other than a range in which the pixel control signal line connection electrode 320 is arranged (formed) can be used more effectively than that in the first modified example.

In the second modified example of the second arrangement example of the solid-state imaging device 2 shown in FIG. 9, a case in which the region where the pixel control circuit 31 is arranged is set at a position close to the left side of the pixel array unit 10 in the row direction and hence the region of the pixel control circuit 31 is arranged close to a position other than the center is shown. However, a method in which the region of the pixel control circuit 31 is arranged close to the position other than the center may be another method. For example, even when the region where the pixel control circuit 31 is arranged is arranged at a position close to the right side of the pixel array unit 10 in the row direction, a similar effect can be obtained. Also, for example, even when the region where the pixel control circuit 31 is arranged is divided into two, one region is arranged at a position close to the left side of the pixel array unit 10 in the row direction, and the other region is arranged at a position close to the right side of the pixel array unit 10 in the row direction, a similar effect can be obtained.

Also in the solid-state imaging device 2 of the second embodiment, as in the solid-state imaging device 1 of the first embodiment, a case in which lengths of wiring of the vertical pixel control signal lines VPcnt are set to be the same to equalize loads on the pixel control circuit units 311 is shown. However, in the solid-state imaging device 2 of the second embodiment, as in the solid-state imaging device 1 of the first embodiment, the length of the wiring of the vertical pixel control signal line VPcnt is also not limited to lengths shown in FIG. 6, FIG. 8, and FIG. 9. For example, the length of the wiring of the vertical pixel control signal line VPcnt of each pixel control circuit unit 311 may be a length up to the pixel control signal line connection electrode 320. In this case, in the solid-state imaging device 2 of the second embodiment, the load of the vertical pixel control signal line VPcnt also changes for each pixel control circuit unit 311, but output driving capability of each pixel control circuit unit 311 may be adjusted in accordance with the wiring length of the vertical pixel control signal line VPcnt as in the solid-state imaging device 1 of the first embodiment.

Third Embodiment

Next, a third embodiment of the present invention will be described. An overview, a schematic configuration, and a pixel configuration of a solid-state imaging device according to the third embodiment of the present invention (hereinafter referred to as a "solid-state imaging device 3") are similar to the overview, the schematic configuration, and the pixel configuration of the solid-state imaging device 1 according to the first embodiment shown in FIG. 1 to FIG. 3. The operation of each component included in the solid-state imaging device 3 is also similar to the operation of each component included in the solid-state imaging device 1 of the first embodiment. Accordingly, in the following description, the same reference signs are used for the components of the solid-state imaging device 3 similar to those of the solid-state imaging device 1 of the first embodiment and a detailed description of the components and operations thereof will be omitted.

(Example of Arrangement of Circuit Elements)

Next, an example of an arrangement of circuit elements in the solid-state imaging device 3 (hereinafter referred to as a "third arrangement example") will be described. Also, in the solid-state imaging device 3, as in the solid-state imaging device 1 of the first embodiment, each circuit elements are arranged on either one of the first semiconductor substrate 100 and the second semiconductor substrate 200. Also, components (circuit elements) and wiring of signal lines arranged on the first semiconductor substrate 100 in the third arrangement example are similar to those arranged on the solid-state imaging device 1 of the first embodiment shown in (a) of FIG. 4 in the first arrangement example. That is, also in the third arrangement example, the pixel array unit 10 is arranged on the first semiconductor substrate 100 and the horizontal pixel control signal line HPcnt and the pixel signal output line VPix are similarly wired. Accordingly, in description of the third arrangement example in the solid-state imaging device 3, a detailed description of the arrangement of the components (the circuit elements) on the first semiconductor substrate 100 and the wiring of the signal lines will be omitted.

Figure 10:
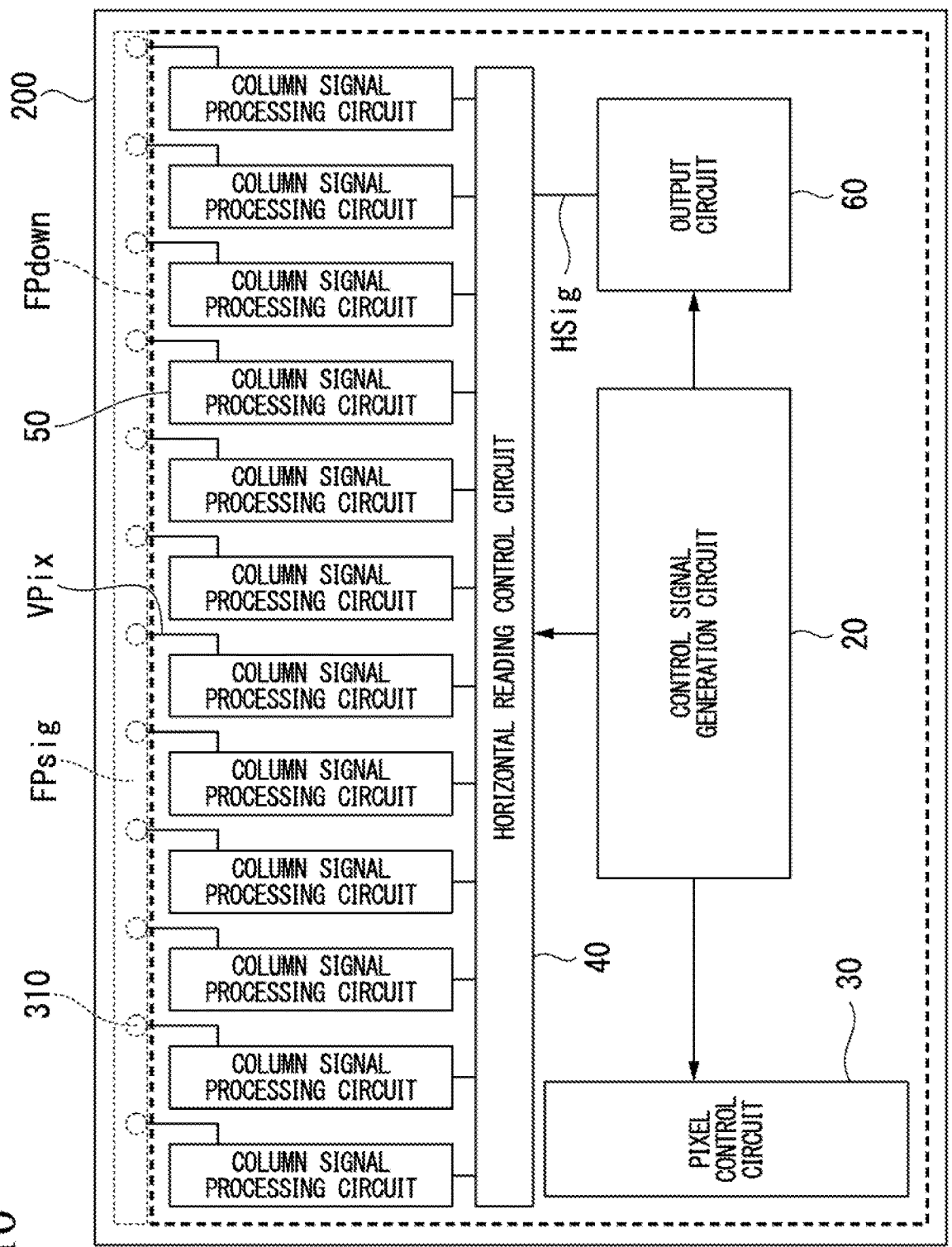
FIG. 10 is a diagram schematically showing an example of an arrangement of components provided in a solid-state imaging device according to a third embodiment of the present invention on a second semiconductor substrates.

In the solid-state imaging device 3, an arrangement of components on the second semiconductor substrate 200 is different from that in the first arrangement example in the solid-state imaging device 1 of the first embodiment shown in (b) of FIG. 4. FIG. 10 is a diagram schematically showing an example of an arrangement of components (circuit elements) provided in the solid-state imaging device 3 according to the third embodiment of the present invention on the second semiconductor substrate 200 (the third arrangement example).

As shown in FIG. 10, in the solid-state imaging device 3, the control signal generation circuit 20, the pixel control circuit 30, the horizontal reading control circuit 40, the column signal processing circuit 50, and the output circuit 60 are arranged on the second semiconductor substrate 200. At this time, in the solid-state imaging device 3, the control signal generation circuit 20, the pixel control circuit 30, the horizontal reading control circuit 40, the column signal processing circuit 50, and the output circuit 60 are also arranged within the pixel array unit immediate region FPdown on the second semiconductor substrate 200.

In the third arrangement example, a region where the pixel control circuit 30 is arranged within the pixel array unit immediate region FPdown is assumed to be a region having a shape along the column direction (the vertical direction) of the pixel array unit 10. In the example shown in FIG. 10, a case in which the region where the pixel control circuit 30 is arranged is set to a region with a shape elongated in the same direction as that of the column signal processing circuit 50 in a region of the left side of the pixel array unit 10 in the row direction at a position of an opposite side of the pixel signal line connection region FPsig is shown. That is, in the third arrangement example, a case in which the region where the pixel control circuit 30 is arranged is set to a region having a width narrower than the width of the pixel array unit 10 in the row direction along an edge of a side on which the pixel 11 of the first column in the first row in the pixel array unit 10 is arranged in the pixel array unit immediate region FPdown is shown.

When the length of the region of the pixel control circuit 30 in the third arrangement example is set to be equal to the width of the pixel array unit 10 in the column direction, it is considered to be equivalent to a region where the pixel control circuit is arranged in a general solid-state imaging device. However, in this case, it is difficult to secure a region where the column signal processing circuit 50 is arranged in a region overlapping the region where the pixel control circuit 30 is arranged. In other words, in the third arrangement example, by making the length of the region of the pixel control circuit 30 shorter than the width of the pixel array unit 10 in the column direction, both the region where the pixel control circuit 30 is arranged and the region where the column signal processing circuit 50 is arranged are secured.

Also in the third arrangement example, the other components (the control signal generation circuit 20, the horizontal reading control circuit 40, the column signal processing circuit 50, and the output circuit 60) arranged on the second semiconductor substrate 200 are arranged in a region with an appropriate shape at a position where routing of signal lines for connecting the components within the second semiconductor substrate 200 is facilitated as in the first arrangement example in the solid-state imaging device 1 of the first embodiment.

Also in the third arrangement example, as in the first arrangement example in the solid-state imaging device 1 of the first embodiment, the pixel signal output line VPix is connected between the first semiconductor substrate 100 and the second semiconductor substrate 200 by the pixel signal line connection electrode 310 formed in the pixel signal line connection region FPsig. Also, in the third arrangement example, as in the first arrangement example of the solid-state imaging device 1 of the first embodiment, the three pixel control signals output by the pixel control circuit 30 arranged in the second semiconductor substrate 200 are electrically connected to the corresponding pixels 11 arranged in the first semiconductor substrate 100 by the pixel control signal line connection electrode 320 formed within the pixel array unit immediate region FPdown.

In the third arrangement example, in the second semiconductor substrate 200, the pixel control signal lines Pcnt of the pixel control signals output by the pixel control circuit 30 arranged in the region having the shape along the column direction (the vertical direction) of the pixel array unit 10 are temporarily wired along the row direction (the horizontal direction) of to the pixel array unit 10. In the third arrangement example, the position of the pixel control signal line connection electrode 320 corresponding to each pixel control signal line Pcnt is moved to a position of the corresponding horizontal pixel control signal line HPcnt of the pixel array unit 10 in the column direction (the vertical direction).

In the third arrangement example, a configuration for moving the position where the pixel control signal line connection electrode 320 is formed is similar to a configuration for moving a position where the pixel control signal line connection electrode 320 is formed in the solid-state imaging device 2 of the second embodiment shown in FIG. 7. More specifically, the configuration of moving the position where the pixel control signal line connection electrode 320 shown in FIG. 7 is formed is similar to a configuration in which the direction of the vertical pixel control signal line VPcnt is rotated by 90° and the vertical pixel control signal line VPcnt is conceived as the pixel control signal line Pcnt temporarily wired along the row direction (the horizontal direction) of the pixel array unit 10.

Thereby, in the third arrangement example, each of the three pixel control signals generated and output by each pixel control circuit unit 301 provided in the pixel control circuit 30 is also transferred to the corresponding horizontal pixel control signal line HPcnt via the pixel control signal line Pcnt, the intra-substrate connection electrode TH, the chip connection electrode movement signal line MW, and the pixel control signal line connection electrode 320, and input to the pixels 11.

Figure 11:
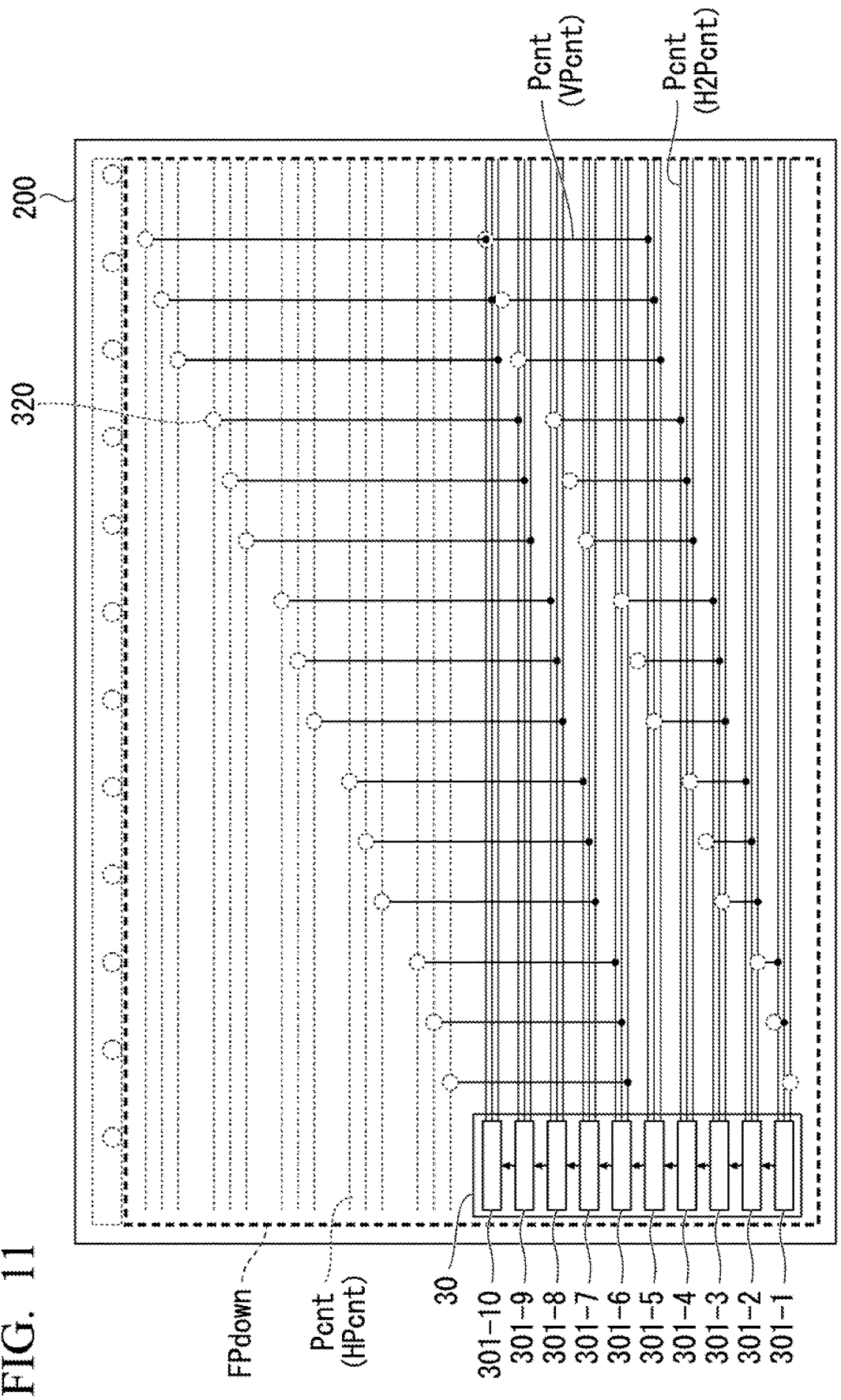
FIG. 11 is a diagram schematically showing an example of an arrangement of chip connection electrodes in the second semiconductor substrate of the solid-state imaging device according to the third embodiment of the present invention.

The arrangement of the pixel control signal line connection electrodes 320 in the third arrangement example of the solid-state imaging device 3 will be described. FIG. 11 is a diagram schematically showing an example of the arrangement of chip connection electrodes (pixel control signal line connection electrodes 320) in the second semiconductor substrate 200 of the solid-state imaging device 3 according to the third embodiment of the present invention. In FIG. 11, an example of the arrangement of the pixel control signal line connection electrodes 320 in the second semiconductor substrate 200 in which components (circuit elements) of the solid-state imaging device 3 are arranged as shown in FIG. 10 is shown.

In the following description, the pixel control signal line Pcnt wired along the row direction (the horizontal direction) of the pixel array unit 10 in the second semiconductor substrate 200 is referred to as a "second substrate horizontal pixel control signal line H2Pcnt" to distinguish it from the horizontal pixel control signal line HPcnt for transferring a pixel control signal to each pixel 11 in the first semiconductor substrate 100. Also, in the following description, for ease of description, a signal line for moving a position of a configuration of the intra-substrate connection electrode TH and the chip connection electrode movement signal line MW connected to each of the second substrate horizontal pixel control signal lines H2Pcnt, i.e., the pixel control signal line connection electrode 320, to a position intersecting the corresponding horizontal pixel control signal line HPcnt, is referred to as a "vertical pixel control signal line VPcnt."

In FIG. 11, as in the first arrangement example of the solid-state imaging device 1 of the first embodiment shown in FIG. 5, the horizontal pixel control signal line HPcnt wired along the row direction (the horizontal direction) of the pixel array unit 10 within the first semiconductor substrate 100 to transfer the pixel control signal to each pixel 11 is indicated by a dotted line.

In FIG. 11, a plurality of pixel control circuit units 301 provided in the pixel control circuit 30 are shown. Each pixel control circuit unit 301 generates and outputs three pixel control signals (the pixel control signal φTX, the pixel control signal φRST, and the pixel control signal φSEL) for outputting (reading) a pixel signal of the pixel 11 of the corresponding row to the pixel signal output line VPix while sequentially transferring (shifting) a reading timing signal input from the control signal generation circuit 20. That is, in the pixel control circuit 30, the pixel control circuit units 301 corresponding to the pixels 11 of the rows are arranged in an order of the rows of the pixels 11. Also, in FIG. 11, each pixel control circuit unit 301 provided in the pixel control circuit 30 is shown with a number indicating a row of the corresponding pixel 11 after "-" following the reference numeral of pixel control circuit units 301.

As described above, the second substrate horizontal pixel control signal line H2Pcnt configured to transfer each pixel control signal output by the pixel control circuit 30 is wired along the row direction (the horizontal direction) of the pixel array unit 10 within the pixel array unit immediate region FPdown within the second semiconductor substrate 200. That is, as shown in FIG. 11, each of the three pixel control signals generated by each pixel control circuit unit 301 is transferred along the row direction (the horizontal direction) of the pixel array unit 10 through the corresponding second substrate horizontal pixel control signal line H2Pcnt.

As shown in FIG. 11, an interval (a wiring pitch) between the horizontal pixel control signal lines HPcnt wired within the first semiconductor substrate 100 is different from an interval (a wiring pitch) between the second substrate horizontal pixel control signal lines H2Pcnt configured to transfer the pixel control signal output by the pixel control circuit unit 301 provided in the pixel control circuit 30 arranged on the second semiconductor substrate 200. Therefore, in the third arrangement example, by the vertical pixel control signal line VPcnt formed as in the configuration for moving the position where the pixel control signal line connection electrode 320 shown in FIG. 7 is formed, the horizontal pixel control signal line HPcnt and the second substrate horizontal pixel control signal line H2Pcnt are electrically connected by moving a position where the pixel control signal line connection electrode 320 is arranged (formed) to a position where it intersects the horizontal pixel control signal line HPcnt. That is, in the third arrangement example, the horizontal pixel control signal line HPcnt and the second substrate horizontal pixel control signal line H2Pcnt are electrically connected according to a method similar to so-called pitch conversion for converting the wiring pitch of the second substrate horizontal pixel control signal line H2Pcnt into the wiring pitch of the horizontal pixel control signal line HPcnt by using the vertical pixel control signal line VPcnt.

More specifically, the pixel control circuit 30 having the configuration shown in FIG. 11 is assumed to have a configuration in which the pixel control circuit units 301 corresponding to a first row, a second row, . . . , a tenth row in order from the left side to the right side are arranged. Also, in the first semiconductor substrate 100, the rows of the pixels 11 arranged in the pixel array unit 10 are assumed to be the first row, the second row, . . . , the tenth row from the lower side to the upper side.

In this configuration, the vertical pixel control signal line VPcnt connected to the second substrate horizontal pixel control signal line H2Pcnt corresponding to each of the three pixel control signals generated and output by the pixel control circuit unit 301 corresponding to the first row is wired along the column direction (the vertical direction) of the pixel array unit 10. Then, the pixel control signal line connection electrode 320 corresponding to the first row is arranged (formed) at a position where the vertical pixel control signal line VPcnt intersects the horizontal pixel control signal line HPcnt corresponding to the pixel 11 of the first row intersect. The second substrate horizontal pixel control signal line H2Pcnt corresponding to the first row and the horizontal pixel control signal line HPcnt corresponding to the first row are electrically connected by the vertical pixel control signal line VPcnt corresponding to the first row and the pixel control signal line connection electrode 320. Each of the three pixel control signals generated and output by the pixel control circuit unit 301 corresponding to the first row is transferred through the corresponding second substrate horizontal pixel control signal line H2Pcnt, the vertical pixel control signal line VPcnt, the pixel control signal line connection electrode 320, and the horizontal pixel control signal line HPcnt, and input to the pixel 11 of the first row.

The vertical pixel control signal line VPcnt connected to the second substrate horizontal pixel control signal line H2Pcnt corresponding to each of the three pixel control signals generated and output by the pixel control circuit unit 301 corresponding to the second row is wired along the column direction (the vertical direction) of the pixel array unit 10 and the pixel control signal line connection electrode 320 corresponding to the second row is arranged (formed) at a position where it intersects the horizontal pixel control signal line HPcnt corresponding to the pixel 11 of the second row. The second substrate horizontal pixel control signal line H2Pcnt corresponding to the second row and the horizontal pixel control signal line HPcnt corresponding to the second row are electrically connected by the vertical pixel control signal line VPcnt corresponding to the second row and the pixel control signal line connection electrode 320, and each of the three pixel control signals generated and output by the pixel control circuit unit 301 corresponding to the second row is input to the pixel 11 of the second row.

Likewise, the vertical pixel control signal line VPcnt connected to the second substrate horizontal pixel control signal line H2Pcnt corresponding to each row is wired along the column direction (the vertical direction) of the pixel array unit 10, the pixel control signal line connection electrode 320 corresponding to each row is arranged (formed) at a position where it intersects the horizontal pixel control signal line HPcnt, and the second substrate horizontal pixel control signal line H2Pcnt and the horizontal pixel control signal line HPcnt are electrically connected.

Thereby, in the third arrangement example, as shown in FIG. 11, the pixel control signal line connection electrode 320 corresponding to each row is arranged (formed) at a position in accordance with an interval (a wiring pitch) between the horizontal pixel control signal lines HPcnt and the second substrate horizontal pixel control signal line H2Pcnt and the horizontal pixel control signal line HPcnt corresponding to each row are electrically connected via the vertical pixel control signal line VPcnt and the pixel control signal line connection electrode 320.

In the third arrangement example, the vertical pixel control signal line VPcnt for connecting the second substrate horizontal pixel control signal line H2Pcnt and the horizontal pixel control signal line HPcnt may be wired (formed) at any position along the second substrate horizontal pixel control signal line H2Pcnt and the horizontal pixel control signal line HPcnt. Thereby, in the third arrangement example, as in the solid-state imaging device 2 of the second embodiment, it is possible to increase the interval (the pitch) between the pixel control signal line connection electrodes 320 which are arranged (formed) adjacent to each other. That is, in the third arrangement example, as in the solid-state imaging device 2 of the second embodiment, it is also possible to make the pitch between the pixel control signal line connection electrodes 320 wider than the pitch between the pixel control signal line connection electrodes 320 in the first arrangement example of the solid-state imaging device 1 shown in FIG. 5. Thereby, in the third arrangement example, it is also possible to improve the reliability of the connection between the vertical pixel control signal line VPcnt and the horizontal pixel control signal line HPcnt by the pixel control signal line connection electrode 320 when the solid-state imaging device 3 is manufactured as compared with the first arrangement example in the solid-state imaging device 1 according to the first embodiment.

In this manner, in the solid-state imaging device 3, each of the three pixel control signals generated and output by each pixel control circuit unit 301 and transferred through the corresponding second substrate horizontal pixel control signal line H2Pcnt is transferred to the corresponding horizontal pixel control signal line HPcnt via each corresponding vertical pixel control signal line VPcnt and the pixel control signal line connection electrode 320 and input to the corresponding pixel 11. Thereby, in the solid-state imaging device 3, as in the solid-state imaging device 1 of the first embodiment, the pixel 11 arranged in each row also outputs the pixel signal to the pixel signal output line VPix in accordance with the pixel control signal output from the pixel control circuit 30 and the pixel signal is input to the corresponding column signal processing circuit 50 via the pixel signal line connection electrode 310 arranged within the pixel signal line connection region FPsig. Then, the horizontal reading control circuit 40 reads the processed pixel signal (the output signal) output by each column signal processing circuit 50 performing processing such as noise suppression and AD conversion for each column and output signals of the columns are sequentially output from the output circuit 60 to outside of the solid-state imaging device 3.

According to the third embodiment of the present invention, a solid-state imaging device (the solid-state imaging device 3) includes a first semiconductor substrate (the first semiconductor substrate 100) having a pixel array unit (the pixel array unit 10) in which a plurality of pixels (pixels 11) configured to convert incident light into pixel signals are arranged in a two-dimensional matrix; a second semiconductor substrate (the second semiconductor substrate 200) stacked on a surface of a side opposite to a side on which the light is incident in the first semiconductor substrate 100 and on which a pixel control circuit (the pixel control circuit 30) configured to output pixel control signals (for example, the pixel control signal ϕTX, the pixel control signal ϕRST, and the pixel control signal ϕSEL) for controlling reading of the pixel signals from the pixels 11 and a reading circuit (the horizontal reading control circuit 40, the column signal processing circuit 50, the output circuit 60, and the like) configured to output each output signal obtained by processing each of the read pixel signals (the pixel signal obtained by performing a process such as noise suppression, signal amplification, or AD conversion) are arranged; and a plurality of connection electrodes (the chip connection electrodes 300, particularly, pixel control signal line connection electrodes 320) corresponding to pixel control signal lines (the pixel control signal lines Pcnt) through which the pixel control signals are transferred and configured to electrically connect the corresponding pixel control signal lines Pcnt between the first semiconductor substrate 100 and the second semiconductor substrate 200, wherein substantially all circuit elements of the pixel control circuit 30 and the reading circuit (at least the horizontal reading control circuit 40 and the column signal processing circuit 50) are arranged within a pixel immediate region (the pixel array unit immediate region FPdown) which overlaps a region where the pixel array unit 10 is arranged on the first semiconductor substrate 100 when viewed from the side on which the light is incident, wherein each of the pixel control signal line connection electrodes 320 electrically connects together a first pixel control signal line (the horizontal pixel control signal line HPcnt), which is the pixel control signal line Pcnt wired in the first semiconductor substrate 100, and a second pixel control signal line (the vertical pixel control signal line VPcnt including the intra-substrate connection electrode TH and the chip connection electrode movement signal line MW), which is the pixel control signal line Pcnt wired in the second semiconductor substrate 200 within the pixel array unit immediate region FPdown, and wherein the pixel control circuit 30 is arranged along an edge of the pixels 11 in the column direction arranged in the pixel array unit 10 in the pixel array unit immediate region FPdown and includes a plurality of pixel control circuit units (the pixel control circuit units 301) corresponding to each row of the pixels 11 arranged in the pixel array unit 10 and configured to output the pixel control signals for reading the pixel signals from the pixels 11 from the corresponding rows.

Also, according to the third embodiment of the present invention, the solid-state imaging device 3 in which each of the pixel control circuit units (the pixel control circuit units 301) are sequentially arranged in an order of rows of the corresponding pixels 11 within a region having a width narrower than a width of the pixels 11 in the column direction arranged in the pixel array unit 10 along the column direction of the pixels 11 arranged in the pixel array unit 10, the horizontal pixel control signal line HPcnt is wired along the row direction of the pixels 11 arranged in the pixel array unit 10 in common to the pixels 11 arranged in the same row, the vertical pixel control signal line VPcnt is connected to a third pixel control signal line (the second substrate horizontal pixel control signal line H2Pcnt) wired to transfer the pixel control signal along the row direction of the pixels 11 arranged in the pixel array unit 10 from a position at which the pixel control circuit unit 301 is arranged by the intra-substrate connection electrode TH and wired along the column direction of the pixels 11 arranged in the pixel array unit 10 from a position connected to the second substrate horizontal pixel control signal line H2Pcnt, and each of the pixel control signal line connection electrodes 320 is arranged at a position where the corresponding horizontal pixel control signal line HPcnt intersects the corresponding vertical pixel control signal line VPcnt and distances to the pixel control signal line connection electrodes 320 connected to the plurality of pixel control circuit units 301 differ according to each row of corresponding pixels 11 is configured.

As described above, in the solid-state imaging device 3 of the third embodiment, as in the solid-state imaging device 1 of the first embodiment, the pixel array unit 10 is arranged on the first semiconductor substrate 100, and the control signal generation circuit 20, the pixel control circuit 30, the horizontal reading control circuit 40, the column signal processing circuit 50, and the output circuit 60 are arranged within the pixel array unit immediate region FPdown in the second semiconductor substrate 200 serving as the side below the pixel array unit 10 arranged on the first semiconductor substrate 100. At this time, in the solid-state imaging device 3 of the third embodiment, as shown in the third arrangement example, the region where the pixel control circuit 30 is arranged is defined as a region having a shape along the column direction (the vertical direction) of the pixel array unit 10, and the second substrate horizontal pixel control signal line H2Pcnt corresponding to each pixel control signal output by the pixel control circuit 30 is wired along the row direction (the horizontal direction) of the pixel array unit 10. Furthermore, in the solid-state imaging device 3 of the third embodiment, as shown in the third arrangement example, the vertical pixel control signal line VPcnt connected to the second substrate horizontal pixel control signal line H2Pcnt is wired along the column direction (the vertical direction) of the pixel array unit 10 within the pixel array unit immediate region FPdown and a position where the pixel control signal line connection electrode 320 is arranged (formed) is moved to a position where the horizontal pixel control signal line HPcnt and the vertical pixel control signal line VPcnt intersect. In the solid-state imaging device 3 of the third embodiment, as shown in the third arrangement example, within the pixel array unit immediate region FPdown, the vertical pixel control signal lines VPcnt, i.e., the second substrate horizontal pixel control signal line H2Pcnt and the horizontal pixel control signal line HPcnt, are electrically connected by the pixel control signal line connection electrode 320.

Thereby, in the solid-state imaging device 3 of the third embodiment, as in the solid-state imaging device 1 of the first embodiment, both the pixel control circuit 30 and the column signal processing circuit 50 are also arranged within the pixel array unit immediate region FPdown serving as the side below the pixel array unit 10 and hence it is possible to reduce the projection area of the solid-state imaging device 3. Moreover, in the solid-state imaging device 3 of the third embodiment, it is possible to increase a pitch when each pixel control signal line connection electrode 320 is arranged (formed) according to a position where the vertical pixel control signal line VPcnt is wired (formed) and improve the reliability when the first semiconductor substrate 100 and the second semiconductor substrate 200 are stacked (bonded) and the manufacturing yield of the solid-state imaging device 3 as in the solid-state imaging device 2 of the second embodiment.

In the example of the arrangement of the chip connection electrodes (the pixel control signal line connection electrodes 320) in the third arrangement example of the solid-state imaging device 3 shown in FIG. 11, a case in which the vertical pixel control signal line VPcnt is wired (formed) at a position where the second substrate horizontal pixel control signal lines H2Pcnt corresponding to the pixel control circuit units 301 are connected to the horizontal pixel control signal line HPcnt in order is shown. However, as described above, the position where the vertical pixel control signal line VPcnt is wired (formed) may be any position along the second substrate horizontal pixel control signal line H2Pcnt and the horizontal pixel control signal line HPcnt. Accordingly, the position and the order in which the vertical pixel control signal line VPcnt is wired (formed) in the solid-state imaging device 3 are not limited to the positions and the order shown in FIG. 11. For example, in the solid-state imaging device 3, the position and the order in which the vertical pixel control signal line VPcnt is wired (formed) may be configured to be classified and combined according to each same type of pixel control signal generated and output by different pixel control circuit units 301, i.e., each pixel control signal ϕTX, each pixel control signal ϕRST, and each pixel control signal ϕSEL.

In the solid-state imaging device 3 of the third embodiment, unlike the solid-state imaging device 1 of the first embodiment and the solid-state imaging device 2 of the second embodiment, the length of the wiring of the vertical pixel control signal line VPcnt differs according to each pixel control circuit unit 301. However, in the solid-state imaging device 3 of the third embodiment, on the basis of a concept similar to those of the solid-state imaging device 1 of the first embodiment and the solid-state imaging device 2 of the second embodiment, output driving capability in each pixel control circuit unit 301 may be adjusted in accordance with the wiring length of the vertical pixel control signal line VPcnt.

A case in which the components provided in the solid-state imaging device 3 are similar to those provided in the solid-state imaging device 1 of the first embodiment has been described. However, the components provided in the solid-state imaging device 3 may be similar to those provided in the solid-state imaging device 2 of the second embodiment. That is, the solid-state imaging device 3 may be configured to include the pixel control circuit 31 which is a configuration of an address decoder, instead of the pixel control circuit 30 which is a configuration of a shift register.

As described above, according to each embodiment of the present invention, in a solid-state imaging device having a configuration in which components are separately arranged on a plurality of semiconductor substrates and the plurality of semiconductor substrates are stacked, a pixel array unit in which a plurality of pixels are arranged in a two-dimensional matrix is arranged on a first semiconductor substrate. Also, in each embodiment of the present invention, other components constituting the solid-state imaging device are arranged within a region immediately below the pixel array unit in a second semiconductor substrate serving as the side below the pixel array unit arranged on the first semiconductor substrate. In each embodiment of the present invention, within the region immediately below the pixel array unit in the second semiconductor substrate, a chip connection electrode for electrically connecting a signal line of a component arranged on the first semiconductor substrate and a signal line of a component arranged on the second semiconductor substrate is arranged (formed). Thereby, in each embodiment of the present invention, it is possible to reduce a projection area of the solid-state imaging device to substantially the same size as a size of the region of the pixel array unit arranged on the first semiconductor substrate.

Also, in each embodiment of the present invention, an interval (a pitch) between chip connection electrodes arranged (formed) adjacent to each other is increased by moving a position where each chip connection electrode corresponding to a signal line of a component is arranged (formed) within a region immediately below the pixel array unit in the second semiconductor substrate. Thereby, in each embodiment of the present invention, it is possible to improve the reliability when a signal line of a component arranged on the first semiconductor substrate and a signal line of a component arranged on the second semiconductor substrate are electrically connected. Thereby, in each embodiment of the present invention, it is possible to improve the yield when the solid-state imaging device is manufactured.

In each embodiment of the present invention, an example in which all components other than the pixel array unit (the pixel array unit 10 in each embodiment) (the control signal generation circuit 20, the pixel control circuit 30, the horizontal reading control circuit 40, column signal processing circuit 50, and the output circuit 60 in each embodiment) are included within a region immediately below the pixel array unit in the second semiconductor substrate (the pixel array unit immediate region FPdown in each embodiment) is shown. However, according to the configuration of the solid-state imaging device, a case in which all components other than the pixel array unit are not included within the region immediately below the pixel array unit in the second semiconductor substrate may also be conceived. That is, it is also conceivable that a region where any component is formed may be extended to a region outside a region immediately below the pixel array unit in the second semiconductor substrate. In this case, although a projection area of the solid-state imaging device cannot be reduced to substantially the same size as the size of the region of the pixel array unit arranged on the first semiconductor substrate, it is possible to obtain an effect of size reduction of the solid-state imaging device by applying a concept of the present invention. More specifically, it is desirable that all the components other than the pixel array unit 10 be included within the pixel array unit immediate region FPdown. However, if at least the pixel control circuit 30 and the column signal processing circuit 50 are substantially included within the pixel array unit immediate region FPdown, i.e., if most of the regions for arranging at least the pixel control circuit 30 and the column signal processing circuit 50 are included within the pixel array unit immediate region FPdown, the effect of size reduction of the solid-state imaging device according to the present invention can be obtained. In other words, although a magnitude of the effect obtained by a proportion in which the regions of the pixel control circuit 30 and the column signal processing circuit 50 fall within the pixel array unit immediate region FPdown changes, the effect of size reduction of the solid-state imaging device according to the present invention can be obtained if the regions of the pixel control circuit 30 and the column signal processing circuit 50 are included within the pixel array unit immediate region FPdown.

In each embodiment of the present invention, a configuration in which a signal line through which each pixel (the pixel 11 in each embodiment) outputs a pixel signal (a pixel signal output line VPix in each embodiment) is electrically connected by the chip connection electrode (the pixel signal line connection electrode 310 in each embodiment) formed within the corresponding signal line connection region (the pixel signal line connection region FPsig in each embodiment) between the first semiconductor substrate and the second semiconductor substrate is shown. The example in which the signal line connection region is arranged outside the region immediately below the pixel array unit in the second semiconductor substrate is shown. However, by applying the concept of the present invention, it is possible to adopt a configuration in which a chip connection electrode (the pixel signal line connection electrode 310) for connecting the signal line (the pixel signal output line VPix) of the pixel signal between the first semiconductor substrate and the second semiconductor substrate is also arranged (formed) inside the region immediately below the pixel array unit in the second semiconductor substrate. Thereby, it is possible to further reduce the projection area of the solid-state imaging device. For example, the projection area of the solid-state imaging device is possible to be reduced to the same size as the size of the region of the pixel array unit arranged on the first semiconductor substrate.

While preferred embodiments of the present invention have been described and shown above, it should be understood that these are exemplary of the invention and the present invention is not limited to these embodiments and modified examples thereof. Within a range not departing from the gist or spirit of the present invention, additions, omissions, substitutions, and other modifications to the configuration can be made.

Also, the present invention is not to be considered as being limited by the foregoing description, and is limited only by the scope of the appended claims.

Also, in the solid-state imaging device according to each embodiment of the present invention, two semiconductor substrates may be connected by chip connection electrodes or three or more semiconductor substrates may be connected by chip connection electrodes. In the case of a solid-state imaging device in which three or more semiconductor substrates are connected by chip connection electrodes, two semiconductor substrates among them correspond to the first semiconductor substrate and the second semiconductor substrate according to the claims.

What is claimed is:
1. A solid-state imaging device comprising:
a first semiconductor substrate having a pixel array unit in which a plurality of pixels configured to convert incident light into pixel signals are arranged in a two-dimensional matrix;
a second semiconductor substrate stacked on a surface of a side opposite to a side on which the light is incident in the first semiconductor substrate and on which a pixel control circuit configured to output pixel control signals for controlling reading of the pixel signals from the pixels and a reading circuit configured to output each output signal obtained by processing each of the read pixel signals are arranged; and
a plurality of connection electrodes corresponding to pixel control signal lines through which the pixel control signals are transferred and configured to electrically connect the corresponding pixel control signal lines between the first semiconductor substrate and the second semiconductor substrate,
wherein substantially all circuit elements of the pixel control circuit and the reading circuit are arranged within a pixel immediate region which overlaps a region where the pixel array unit is arranged on the first semiconductor substrate when viewed from the side on which the light is incident,
wherein each of the connection electrodes electrically connects together a first pixel control signal line, which is the pixel control signal line wired in the first semiconductor substrate, and a second pixel control signal line, which is the pixel control signal line wired in the second semiconductor substrate within the pixel immediate region, and
wherein the pixel control circuit is arranged along either one of a row direction and a column direction of the pixels arranged in the pixel immediate region, and includes a plurality of pixel control circuit units corresponding to each row of the pixels arranged and configured to output the pixel control signals for reading the pixel signals from the pixels from the corresponding rows, wherein each of the pixel control circuit units include an address decoder configured to decode an input address signal and output the pixel control signal when the address signal indicates a predetermined address value in a state in which address values different from each other are predetermined, wherein each of the pixel control circuit units are arranged so that the pixel control circuit units corresponding to the pixels of adjacent rows are not adjacent to each other within the region along the row direction, wherein the first pixel control signal line is wired along the row direction in common to the pixels arranged in the same row, wherein the second pixel control signal line is wired along the column direction from a position at which the corresponding pixel control circuit unit is arranged, and wherein each of the connection electrodes is arranged at a position where the corresponding first pixel control signal line intersects the corresponding second pixel control signal line and distances to the connection electrodes connected to the plurality of pixel control circuit units differ according to each corresponding pixel row.

2. The solid-state imaging device according to claim 1, wherein each of the pixel control circuit units are sequentially arranged in an order of rows of the corresponding pixels within a region along the row direction, wherein the first pixel control signal line is wired along the row direction in common to the pixels arranged in the same row, wherein the second pixel control signal line is wired along the column direction from a position at which the corresponding pixel control circuit unit is arranged, and wherein each of the connection electrodes is arranged at a position where the corresponding first pixel control signal line intersects the corresponding second pixel control signal line and distances to the connection electrodes connected to the plurality of pixel control circuit units differ according to each corresponding pixel row.

3. The solid-state imaging device according to claim 1, wherein the second pixel control signal line includes a third pixel control signal line wired to move a position where the corresponding connection electrode is arranged along the row direction from a position where the second pixel control signal line intersects the corresponding first pixel control signal line, and wherein each of the connection electrodes is electrically connected to the corresponding first pixel control signal line at a position moved by the third pixel control signal line.

4. The solid-state imaging device according to claim 3, wherein each of the pixel control circuit units are arranged within a region having a width narrower than a width of the pixel array unit in the row direction.

5. The solid-state imaging device according to claim 4, wherein the region having the narrower width in which each of the pixel control circuit units are arranged is located close to one end or both ends in the row direction.

6. The solid-state imaging device according to claim 1, wherein each of the pixel control circuit units are sequentially arranged in an order of rows of the corresponding pixels within a region having a width narrower than a width thereof in the column direction along the column direction, wherein the first pixel control signal line is wired along the row direction in common to the pixels arranged in the same row, wherein the second pixel control signal line is connected to a third pixel control signal line wired to transfer the pixel control signal along the row direction from a position at which the pixel control circuit unit is arranged and wired along the column direction from a position connected to the third pixel control signal line, and wherein each of the connection electrodes is arranged at a position where the corresponding first pixel control signal line intersects the corresponding second pixel control signal line and distances to the connection electrodes connected to the plurality of pixel control circuit units differ according to each corresponding pixel row.

* * * * *